(12) United States Patent
Fukuzaki et al.

(10) Patent No.: US 7,315,373 B2
(45) Date of Patent: Jan. 1, 2008

(54) WAFER POSITIONING METHOD AND DEVICE, WAFER PROCESS SYSTEM, AND WAFER SEAT ROTATION AXIS POSITIONING METHOD FOR WAFER POSITIONING DEVICE

(75) Inventors: Yoshiki Fukuzaki, Hiroshima (JP); Tomoyuki Shitaku, Hiroshima (JP)

(73) Assignee: Rorze Corporation, Hiroshima (JP)

( * ) Notice: Subject to any disclaimer, the term of this patent is extended or adjusted under 35 U.S.C. 154(b) by 190 days.

(21) Appl. No.: 10/495,563
(22) PCT Filed: Nov. 13, 2002
(86) PCT No.: PCT/JP02/11847

§ 371 (c)(1),
(2), (4) Date: Nov. 15, 2004

(87) PCT Pub. No.: WO03/043077

PCT Pub. Date: May 22, 2003

(65) Prior Publication Data

US 2005/0078312 A1 Apr. 14, 2005

(30) Foreign Application Priority Data

Nov. 14, 2001 (JP) .............................. 2001-348767
Nov. 14, 2001 (JP) .............................. 2001-349237

(51) Int. Cl.
*G01B 11/00* (2006.01)
(52) U.S. Cl. ...................................................... 356/399
(58) Field of Classification Search ................. 356/399
See application file for complete search history.

(56) References Cited

U.S. PATENT DOCUMENTS 4,887,904 A * 12/1989 Nakazato et al. ........... 356/621

(Continued)

FOREIGN PATENT DOCUMENTS

JP 59-147444 8/1984

(Continued)

*Primary Examiner*—Roy M. Punnoose
(74) *Attorney, Agent, or Firm*—Dickstein Shapiro LLP

(57) ABSTRACT

In wafer positioning by moving a center point (0) of a wafer (21) to a given position and orienting a notch part (21*a*) of the wafer in a given direction, wafer seat drive means (2,3,8, or 9) positions a rotation axis (B) of a wafer seat (16) on a straight line which passes through a center part of a line sensor (4) and extends in the extending direction thereof, and rotates the wafer seat on which the wafer lies around the rotation axis; calculation means (24) finds a wafer notch part position and a maximum or minimum eccentric radius of the wafer based on a rotation angle of the wafer seat and detection results of an outer periphery edge of the wafer lying on the wafer seat by the line sensor, and, from the obtained results, geometrically calculates a rotation axis position and a rotation angle of the wafer when the wafer center point is at the given position and the wafer notch part is oriented in the given direction; and the wafer seat drive means (2, 3, 8, or 9) moves, rotates, and stops the wafer seat (16) so that a rotation axis position and a rotation angle of the wafer seat correspond to the calculated rotation axis position and the calculated rotation angle. In result, speed and precision in a wafer positioning operation can be thereby improved.

16 Claims, 19 Drawing Sheets

U.S. PATENT DOCUMENTS

| | | | |
|---|---|---|---|
| 5,125,791 A | * | 6/1992 | Volovich .................... 348/446 |
| 5,258,823 A | * | 11/1993 | Akamatsu ................... 356/615 |
| 5,851,102 A | * | 12/1998 | Okawa et al. .............. 414/783 |
| 6,400,445 B2 | * | 6/2002 | Nishi et al. ................... 355/72 |

FOREIGN PATENT DOCUMENTS

| | | |
|---|---|---|
| JP | 2-31443 A | 2/1990 |
| JP | 3-50752 A | 3/1991 |
| JP | 3-136264 A | 6/1991 |
| JP | 05-343501 | 12/1993 |
| JP | 06-224285 | 8/1994 |
| JP | 7-260445 A | 10/1995 |
| JP | 11-326229 * | 11/1999 |

\* cited by examiner

PRIOR ART

PRIOR ART

WAFER POSITIONING METHOD AND DEVICE, WAFER PROCESS SYSTEM, AND WAFER SEAT ROTATION AXIS POSITIONING METHOD FOR WAFER POSITIONING DEVICE

TECHNICAL FIELD

The present invention relates to a wafer positioning method, which is used in the run-up to, e.g., an inspection, processing, or transfer process or the like of semiconductor wafers and which accurately positions a wafer in a given direction and in a given position, and a wafer positioning device using this method; and a wafer process system comprising a wafer positioning device and using the foregoing method.

The present invention also relates to a method to position a rotation axis of a wafer seat on a straight line which passes through the center part of a line sensor and extends in the extending direction thereof as a preliminary step in a positioning device, which is used in the run-up to an inspection, processing, or transfer process or the like of semiconductor wafers and which accurately positions a wafer in a given direction and in a given position; and a wafer positioning device using this method.

BACKGROUND ART

In a manufacturing process of semiconductor devices, a plurality of wafers which become substrates for the semiconductor devices are housed in a cassette 20 comprising a plurality of shelves as shown in FIG. 1 and transported in a clean room. Recently, in order to highly prevent foreign materials causing short circuit of a fine electric circuit on wafers from adhering to the wafers, the wafers are transported while being housed in a hermetically sealed clean container. These wafers are taken out from the clean container in a highly clean booth, and then provided with various treatments such as inspection and processing. After that, when a wafer is returned to the cassette or the clean container by using a transport device such as a robot, it is necessary to align the wafer center point with the center position of a finger of the robot before starting housing operation into the cassette etc., in order to prevent failures, such as damaging or dropping the wafer due to contact between the wafer and the cassette wall.

In the processes requiring information on the wafer position such as patterning, deposition, and chemical vapor deposition processes and various inspections, consistently and accurately positioning a notch part of the wafer outer periphery edge such as an orientation flat (hereinafter referred to as "OF") and a notch, and a wafer center point in given positions is an important run-up operation. Therefore, before shifting to the foregoing processes, it is necessary to lay the wafer on a wafer positioning device generally called an aligner, detect the position of the wafer center point and the orientation of the notch part, accurately move the wafer to the correct position, and then hand the wafer over to various processing devices, various inspection devices, robots or the like.

The wafer positioning device generally comprises a small circular table called a spindle having a size to allow the wafer to lie thereon as a wafer seat on the rotational shaft. The center point position and the notch part position of the circular wafer are calculated by rotating the spindle along with the wafer placed thereon by rotation of the rotational shaft; and detecting an eccentric radius from the rotational shaft or the rotation axis of the spindle to the wafer outer periphery edge and a rotation angle by using a line sensor and an angle sensor such as an encoder. After that, the wafer is moved in the extending direction of an X axis and a Y axis by the distance calculated as above, and rotated by the angle calculated as above. Then, the wafer is accurately positioned in a given position and a given direction. Such a positioning device has been conventionally suggested in, for example, Japanese Patent Application Opened No. S59(1984)-147444, Japanese Patent Application Opened No. H05(1993)-343501, and Japanese Patent Application Opened No. H06(1994)-224285.

For example, a device described in Japanese Patent Application Opened No. H05(1993)-343501 comprise drive means to move a wafer seat in the direction of the X, Y, and Z axes and rotate the wafer seat. In this device, data obtained from outer periphery edge detection means by rotating a wafer is A/D-converted, the converted data is directly transferred to a storage circuit by DMA data transmission means. Calculation time is thereby shortened. Further, in this device, as shown in FIG. 19 an eccentric amount Le and an eccentric angle 60 are calculated from wafer outer periphery signals Lx1, Lx2, Lx3, and Lx4 at one end point 0x1 of the notch part and other three points 0x2, 0x3, 0x4 on the outer periphery edge, which are distanced from 0x1 sequentially by each 90° about the rotation axis B, by processor means by using the following expressions:

$$Le = \tfrac{1}{2} \cdot \{(Lx3-Lx1)^2 + (Lx4-Lx2)^2\}^{1/2}$$

$$\theta 0 = \tan^{-1}\{(Lx3-Lx1)/(Lx4-Lx2)\}$$

Here, the eccentric angle θ0 of one end of the notch part is determined by storing and comparing a ratio between fine angle Δθx obtained for the foregoing 4 points and corresponding eccentric radii ΔLx and the immediately preceding ratio ΔLx−1/Δθx−1 and obtaining a point wherein the ratio becomes a fixed value or more and ΔLx becomes the maximum while the wafer rotates 360°. In result, first, the wafer center point is moved to a given position, the wafer is retaken up, and the rotation axis is aligned with the wafer center point. Next, the wafer is rotated until the notch part is moved to a given position, and then stopped. Consequently, shortening the positioning time for all processes from conventional 8 to 10 sec. down to 3 to 4 sec. is attained.

In Japanese Patent Application Opened No. H06(1994)-224285, a wafer positioning device having a machine construction similar to the foregoing is used. As shown in FIG. 20, a sum of four eccentric radii to four points at which two orthogonal straight lines passing through the rotation axis B intersect the wafer outer periphery edge is approximated by about twice the diameter. When the perpendicular straight lines are rotated by every certain angle 0 (=about 10°) up to 360°, and eccentric radii an, bn, cn, and dn are measured, results of Ln=an+bn+cn+dn are almost constant over the angle 360°. However, since the result of Ln=an+bn+cn+dn for the notch part is the minimum, the notch part is thereby obtained. Here, a deviance between the rotation axis B and the wafer center point is obtained from the four eccentric radii derived from the perpendicular straight lines passing through the wafer center point.

Incidentally, in recent semiconductor processes, wafer sizes have become large, e.g. a wafer diameter of 300 mm in order to improve productivity, and wafer weight has become large, twice the conventional weight. Despite the increased wafer sizes, the wafer positioning device is also required to have a high speed and high precision.

However, in any of the foregoing conventional devices, data is collected over 360° every fine angle for four points where the straight lines perpendicular to each other passing through the rotation axis intersect the wafer outer periphery edge. Therefore it takes time to collect and calculate lots of data. Further, since the wafer has to be rotated at least one revolution, its rotation time is also required. Furthermore, in the foregoing conventional devices, the wafer has to be retaken up between wafer center point alignment movement and angle alignment for the notch part. Therefore, entire duration is not short enough.

In any of the foregoing conventional devices, respective split angles of 360° are rough. Further, when the notch part is detected, the minimum point, which is the lowest point dropped from a smooth line drawn in a diagram showing a relation between eccentric radii and rotational angles, for example, shown in FIG. 9 is regarded as a center of the notch part, which is not an original center of the notch part. Therefore, accuracy is lacked, and there is a problem that the wafer positioning precision is low.

In order to solve the issues of the high speed and the high precision, inventors of the present application have devoted themselves to research on a positioning method which does not require the time-consuming operation processes, such as retaking up the wafer and stop or re-rotation in the middle of rotation, and the process for processing lots of data, causing load on calculation means such as a calculator. In result, a method which is significantly enables high precision and shortening time compared to the conventional methods has been found, and a wafer positioning device and a wafer process system have also been developed.

Furthermore, in order to calculate a position of the wafer center point by rotating the wafer as described previously, it is necessary to accurately position the rotation axis of the spindle at the point where a straight line in the direction of spindle movement (generally an X axis of the positioning device) and a straight line which passes through the center part of the line sensor and extends in the extending direction thereof (generally a straight line parallel to a Y axis of the positioning device) cross perpendicular to each other when operation is started. Otherwise, a correct eccentric radius from the rotation axis of the spindle to the wafer outer periphery edge cannot be measured.

Therefore, in any of the conventional positioning devices suggested in the foregoing documents, a position relation between the line sensor and the rotation axis of the spindle is mechanically fixed as above. These conventional devices are based on the assumption that such a position relation does not change over long periods.

However, actually, when the positioning device is assembled, when the positioning device is installed at a semiconductor factory, when some object hits the line sensor by accident, causing a position deviance, or when the line sensor is replaced, subtle arrangement of the sensor position is required. Skilled engineers spend considerable time on the maintenance operation for such an adjustment. Further, when positioning operation is performed while the sensor position remains deviant, if a certain allowance is exceeded, alarm is given and this operation is stopped. Meanwhile, if eccentricity is within an allowance, the wafer positioning operation continues with the eccentricity remained, often resulting in a low-precision positioning.

In light of the foregoing actual conditions, the inventors of the present application have developed a wafer seat rotation axis positioning method in which the wafer positioning device automatically and accurately positions the rotation axis on the line sensor center line perpendicular to an X axis before starting wafer position detection operation, so that a wafer positioning precision based on subsequent wafer position detection operation is improved and that maintenance free of the wafer positioning device is realized.

DISCLOSURE OF THE INVENTION

In the present inventions, the above mentioned objectives are attained by deriving conventionally unused, totally new accurate theoretical expressions without using approximate values, collecting the very minimum of data, and assigning the data to such expressions.

That is, a wafer positioning method of the invention is a method of positioning a wafer with a wafer positioning device comprising a line sensor, a wafer seat capable of laying a wafer, wafer seat drive means capable of moving the wafer seat in two-dimensional directions or three-dimensional directions and rotating the wafer seat around a given rotation axis, and calculation means performs wafer positioning by moving a wafer center point to a given position and orienting a wafer notch part in a given direction through a process to calculate a wafer center point position and a notch part angle by the calculation means based on a rotation angle of the wafer seat by the wafer seat drive means and detection results of an outer periphery edge of a circular wafer lying on the wafer seat by the line sensor, the method comprising: positioning the rotation axis of the wafer seat on a straight line which passes through a center part of the line sensdr and which extends in an extending direction thereof, and rotating the wafer seat on which the wafer lies around the rotation axis, by the wafer seat drive means; finding a notch part position of the wafer and a maximum eccentric radius or a minimum eccentric radius of the wafer based on the rotation angle of the wafer seat and the detection results of the outer periphery edge of the wafer lying on the wafer seat by the line sensor, and from the results, geometrically calculating a rotation axis position and a rotation angle of the wafer seat when the wafer center point is located at the given position and the wafer notch part is oriented in the given direction, by the calculation means; and moving, rotating and stopping the wafer seat so that a rotation axis position and a rotation angle of the wafer seat correspond to the calculated rotation axis position and the calculated rotation angle without retaking up the wafer, by the wafer seat drive means.

According to the method of the invention, while the wafer seat drive means positions the rotation axis of the wafer seat on the straight line which passes through the center part of the line sensor and extends in the extending direction thereof, and rotates the wafer seat on which the wafer lies around the rotation axis, the line sensor detects the outer periphery edge of the wafer lying on the wafer seat, the calculation means finds the notch part position of the wafer and the maximum eccentric radius or the minimum eccentric radius of the wafer based on the rotation angle of the wafer seat and the detection results of the outer periphery edge of the wafer lying on the wafer seat by the line sensor, and, from the results, geometrically calculates the rotation axis position and the rotation angle of the wafer seat when the wafer center point is located at the given position and the wafer notch part is oriented in the given direction, and the wafer seat drive means moves, rotates and stops the wafer seat so that the rotation axis position and the rotation angle of the wafer seat correspond to the calculated rotation axis position and the calculated rotation angle without retaking up the wafer. Therefore, it is possible to eliminate time consuming operational processes such as retaking up the wafer, or stopping or the re-rotating the wafer in the middle of rotation, and the process for processing lots of data, causing load on calculation means. Consequently, it is possible to obtain significantly higher-precision wafer positioning than heretofore, and its operation time can be shortened.

Incidentally, in the wafer positioning method of the invention, the calculation means may find $\alpha$, $\beta_1$, $\beta_2$, and Lm based on the rotation angle of the wafer seat and the detection results of the outer periphery edge of the wafer lying on the wafer seat by the line sensor, and calculate d, $\theta$, $\Delta X$, and $\Delta Y$ from the following Expressions (1), (2), (3), and (4), respectively:

$$d = Lm - r \quad (1)$$

$$\theta = \gamma + [\beta_1 + \beta_2 + \arcsin\{(d/r)\sin(\beta_1-\alpha)\} + \arcsin\{(d/r)\sin(\beta_2-\alpha)\}]/2 \quad (2)$$

$$\Delta X = d\sin(\theta - \alpha) \quad (3)$$

$$\Delta Y = d\cos(\theta - \alpha) \quad (4)$$

where

Lm: the maximum eccentric radius or the minimum eccentric radius of the wafer, d: a deviance distance between an eccentric center (wafer seat rotation axis) and the wafer center point, r: a wafer radius (known number), $\theta$: a rotation angle of the wafer seat to stop the notch part in the given direction from a wafer initial reference position, $\alpha$: an angle about the eccentric center from the wafer initial reference position to a position obtained when the eccentric radius firstly becomes the maximum or the minimum, $\beta_1$: an angle about the eccentric center from the wafer initial reference position to a first end of the notch part, $\beta_2$: an angle about the eccentric center from the wafer initial reference position to a final end of the notch part, $\gamma$: an angle about the wafer center point made by the notch part oriented in the given direction and a sensor direction (designated value), $\Delta X$: an X axis direction movement distance, and $\Delta Y$: a Y axis direction movement distance.

Here, the angles $\beta_1$ and $\beta_2$ for the both ends of the notch part may be found by the conventionally known method. However, in order to pursue accuracy, it is most preferable to find the angles $\beta_1$ and $\beta_2$ according to Expressions (6) and (7) which never use approximation. That is, as shown in FIG. 8, where an angle made by a straight line passing through a rotational center B and a wafer center point O and the sensor direction during wafer rotation is $\rho$, an eccentric radius $L_t$ in relation to the rotation angle $\rho$ is theoretically expressed by the following Expression (8), and this relation is shown in FIG. 9.

$$L_t = d\cos\rho + (r^2 - d^2\sin^2\rho)^{1/2} \quad (8)$$

Therefore, for the notch part, the eccentric radius $L_t$ is different from an actual measurement value L. When detecting the difference of $\Delta L = L_t - L$, the position of the notch part can be obtained. Here, as shown in FIG. 6, seen from an initial reference position $A_0$ before wafer rotation, rotation angles $\beta$ for both ends of the notch part are $\beta_1$ and $\beta_2$, which are smaller than $\rho$ in Expression (8) by $\alpha$. Therefore, it is preferable to find the angle $\beta_1$ at $\Delta L_1 = 0$ when $\Delta L_1$ changes from 0 to a positive in relation to a fine displacement angle of an angle about the eccentric center from the wafer initial reference position $A_0$ (rotation axis of the wafer seat) by using the following Expression (6), and find the angle $\beta_2$ at $\Delta L_2 = 0$ when $\Delta L_2$ changes from a positive to 0 in relation to a fine displacement angle of an angle about the eccentric center (rotation axis of the wafer) from the wafer initial reference position $A_0$ by using the following Expression (7):

$$\Delta L_1 = [d\cos(\beta_1-\alpha) + \{r^2 - d^2\sin^2(\beta_1-\alpha)\}^{1/2}] - L \quad (6)$$

$$\Delta L_2 = [d\cos(\beta_2-\alpha) + \{r^2 - d^2\sin^2(\beta_2-\alpha)\}^{1/2}] - L \quad (7)$$

As above, it is preferable to use the foregoing Expressions (1) to (4), (6), and (7) which use no approximation. However, practically, instead of Expression (2), the following Expression (5) with a small error, which can be obtained by applying Taylor expansion to Expression (2), can be used:

$$\theta \approx \gamma + [\beta_1 + \beta_2 + (d/r)\{\sin(\beta_1-\alpha) + \sin(\beta_2-\alpha)\}]/2 \quad (5)$$

For driving rotation of the wafer seat to collect data by the line sensor for calculations in the foregoing Expressions (1) to (7), analog circuit control means may be applied. Alternatively, digital circuit control means which performs drive control by dividing 360° into 4,000 to 80,000 pulses may be used. In order to attain speeding-up, derive control may be made by segmenting this number of pulses every several pulses as one point.

The line sensor used for the invention may be a transmissive type line sensor or a reflective type line sensor. However, in order to prevent adverse effect on the semiconductor wafer of a fine electric part, the line sensor is preferably an optical line sensor, not a magnetic line sensor. As this optical line sensor, known line sensors such as one comprising a light acceptance device having a slit-shaped light acceptance window, one performing light focus by installing a hog-backed lens to a light emitting device or a light acceptance device, one using laser light, one using infrared light, and one using a CCD light acceptance device can be used. Light rays of the line sensor in the present invention may be radiated perpendicular to the reference plate. However, when the transmissive type sensor is used, light rays may be radiated semi-perpendicular to the reference plate if there is some volatility, e.g., change of light intensity by generation of interference due to direct reflection light to the light acceptance device.

In the present invention, calibration means to high-precisely relate an eccentric amount of the circular wafer and a light acceptance amount may be incorporated into means for processing the data of the line sensor such as the calculation means. Further, a rotation angle sensor, such as a rotary encoder etc., may be used in order to accurately detect a rotation angle of the wafer seat about the foregoing rotation axis. However, when a stepping motor is used for driving rotation of the wafer seat, the rotation angle sensor can be omitted. Note that, as a motor for driving rotation of the wafer seat, other than the foregoing stepping motor, known motors, such as a DC servo motor and an AC servo motor, can be used.

In the present invention, both ends of the notch part are detected and used for calculation regardless that the notch part is an OF (orientation flat) obtained by linearly cutting a part of the wafer or a semicircular notch obtained by cutting a part of the outer periphery edge of the wafer. Therefore, it is not necessary to differentiate the OF from the notch. However, in the method for the conventional device, when the OF is used, an error tends to be large since the notch part is large. Therefore, in order to obtain precision when the OF is used, the wafer positioning method of the invention is particularly preferable.

Meanwhile, a wafer positioning device of the invention using the wafer positioning method of the invention is a wafer positioning device comprising: a line sensor, a wafer seat capable of laying a wafer, wafer seat drive means capable of moving the wafer seat in two-dimensional directions or three-dimensional directions and rotating the wafer seat around a given rotation axis, and calculation means, the wafer positioning device performing wafer positioning by moving a wafer center point to a given position and by orienting a wafer notch part in a given direction through a process to calculate a wafer center point position and a notch part angle by the calculation means based on a rotation angle of the wafer seat by the wafer seat drive means and detection results of an outer periphery edge of a circular wafer lying on the wafer seat by the line sensor, wherein the wafer seat drive means positions the rotation axis of the wafer seat on the straight line which passes through the center part of the line sensor and extends in the extending direction thereof; rotates the wafer seat on which the wafer lies around the rotation axis; and moves, rotates, and stops the wafer seat so that the rotation axis position and the rotation angle of the wafer seat correspond to the rotation axis position and the rotation angle which are calculated by the calculation means, and the calculation means finds the notch part position of the wafer and the maximum eccentric radius or the minimum eccentric radius of the wafer based on the rotation angle of the wafer seat and the detection results of the outer periphery edge of the wafer lying on the wafer seat by the line sensor, and from the found results, geometrically calculates the rotation axis position and the rotation angle of the wafer seat when the wafer center point is positioned at the given position and the wafer notch part is oriented in the given direction.

According to the wafer positioning device of the invention, the above-mentioned wafer positioning method of the invention can be performed. Therefore, it is possible to eliminate time consuming operational processes, such as retaking up the wafer, stopping or the re-rotating the wafer in the middle of rotation, and the process for processing lots of data, causing load on calculation means. Consequently, it is possible to obtain significantly higher-precision wafer positioning than heretofore, and its operation time can be shortened.

Incidentally, the wafer positioning device of the invention can be applied to either a case that movement of the wafer seat by the wafer seat drive means is in the two dimensional directions (X-Y axis directions) or a case in the three dimensional directions (X-Y-X directions). That is, for example, when an extending direction of a straight line which passes through the center part of the line sensor and extends in the extending direction of the sensor is a Y axis direction, an extending direction of the rotation axis of the wafer seat for positioning becomes a Z axis direction, and the wafer seat can be moved on the X-Y axes plane. When the wafer is laid or taken out, the wafer seat drive means of the wafer positioning device may be allowed to move in the Z axis direction if up-and-down motion of the wafer seat is necessary. When the wafer transport device can move in the Z axis direction to lay and take out the wafer, a Z axis drive mechanism for the wafer seat drive means of the wafer positioning device can be omitted. Further, as shown in FIG. 5, the wafer positioning device of the invention may comprise an arm and a finger for transporting a wafer, and drive means for the arm and the finger.

As shown in FIG. 1, a wafer process system of the invention is a wafer process system using the method of the invention, the wafer process system comprising: the wafer positioning device of the invention; an arm and a finger for transporting the wafer; and drive means for the arm and the finger, wherein when wafer positioning is performed by raising the wafer seat from a position where the wafer positioning device has received the wafer, the drive means for the arm and the finger makes the finger wait at a position where the wafer is handed over to the wafer seat, and when wafer positioning is performed by maintaining the wafer seat at a position where the wafer positioning device receives the wafer, the drive means for the arm and the finger makes the finger wait below a position where the wafer has been handed over to the wafer seat.

According to such a wafer process system, after the wafer is handed over to the wafer seat of the wafer positioning device, the finger waits at the handing-over position or slightly below the handing-over position. Therefore, time for the arm for transporting the wafer to move to the wafer positioning device to take the wafer can be omitted. Consequently, it is possible to further contribute to improvement of productivity.

Meanwhile, the wafer positioning device can geometrically position the rotation axis of the wafer seat from the two or more detection results of the reference plate by the line sensor. The above mentioned objective is thereby attained.

That is, a wafer seat rotation axis positioning method of a wafer positioning device of the invention is a method of positioning a wafer seat rotation axis in a wafer positioning device comprising a line sensor, a wafer seat capable of laying a wafer, wafer seat drive means capable of moving the wafer seat at least in a one dimensional direction, i.e., in a one dimensional direction (e.g., X axis), two dimensional directions (e.g., X axis and Y axis), or three dimensional directions (e.g., X axis, Y axis, and Z axis), and rotating the wafer seat around a given rotation axis (e.g., 0 axis), and calculation means, the wafer positioning device performing positioning of the wafer by moving a wafer center point to a given position by the wafer seat drive means through a process to calculate a wafer center point position by the calculation means based on a rotation angle of the wafer seat and detection results of an outer periphery edge of the circular wafer lying on the wafer seat by the line sensor, when the rotation axis of the wafer seat is positioned on a first straight line (e.g., a straight line parallel to the Y axis) which passes through a center part of the line sensor and extends in an extending direction thereof before the calculation process, the method comprising: moving, without rotation, the wafer seat on which a reference plate lies along a second straight line (e.g., X axis) perpendicular to the first straight line so that the rotation axis turns back and passes twice or more between two points sandwiching a position of the rotation axis of the wafer seat when the line sensor detects an outer-most outer periphery edge of the reference plate in a direction of the first straight line, and rotating the wafer seat by a given angle except for 360° and its multiples around the rotation axis when turning back the wafer seat at one or both of the two points, or at points outside the two points, by the wafer seat drive means; geometrically calculating an intersection point position between the second straight line and the first straight line based on data which the line sensor obtains when the reference plate passes without rotation the line sensor twice or more by the turnback movement of the wafer seat and the rotation angle, by the calculation means; and moving the rotation axis to the calculated intersection point position, and positioning the rotation axis on the first straight line, by the wafer seat drive means.

According to the method of the invention, the wafer positioning device automatically positions the rotation axis on the first straight line from the geometric relation based on respective rotation axis positions of the wafer seat when the reference plate passes through the line sensor twice or more without rotation and the line sensor detects the outermost outer periphery edge of the reference plate in the first straight line direction, and a rotation angle about the rotation axis of the wafer seat in turning back. Therefore, the rotation axis of the wafer seat can be accurately positioned on the center line of the line sensor, and precision of the wafer positioning based on the subsequent wafer position detection operation can be improved. In addition, maintenance free of the wafer positioning device can be attained.

Incidentally, as the reference plate, any plate having any outer periphery shape can be used as long as its shape, such as a circle, a hexagon, a square, a rectangle, and a triangle, and its size are known. However, it is preferable to use a disc with which calculation is easy, load on the calculation means is little, and calculation speed becomes high. Regarding passing the reference plate between the two points, two round trips are enough under normal conditions. However, when detection by the line sensor is insufficient and it is necessary to collect data again, the reference plate may be passed thrice or more.

In the method of the invention, the wafer seat on which the reference plate lies is rotated around the rotation axis at the turn-back points on the second straight line by a given angle except for 360° and its multiples wherein the rotation axis position of the wafer seat is not changed when the line sensor detects the outermost outer periphery edge of the reference plate. The angle is preferably 90° or 180°. That is, in the case of 90° and 180°, trigonometric function calculation is unnecessary as mentioned below. Therefore, these angles are preferable since calculation is easy, load on the calculation means is little, and calculation speed becomes high. Particularly, in the case of 180°, calculation of the position difference of the outermost outer periphery edge detected by the line sensor also becomes unnecessary as mentioned below. Therefore, this angle is most preferable since the same effect can be obtained by the simplest calculation expression.

Here, in the case that the reference plate is a known disc such as a circular wafer, an outermost outer periphery edge position of the disc when the line sensor detects the outermost outer periphery edge of the disc in the first straight line direction may be determined on the assumption that it is on a perpendicular bisector EF of a segment between two points A and B or a segment between two points C and D, which are points on the outer periphery edge of the disc across which one fixed point of the line sensor cuts as shown in FIG. 18. In order to minimize its measurement error, two or more fixed points may be set to average positions on the perpendicular bisectors obtained from the respective fixed points. Furthermore, a center line position obtained from the result of direct detection of the wafer outermost outer periphery edge may also be involved in the averaging.

When the circular wafer is used as a reference plate, it is necessary that the line sensor does not detect the notch part, such as an orientation flat and a notch, as an outermost outer periphery edge. When it has been found that the notch part is detected as an outer-most outer periphery when the circular wafer moves on the second straight line due to the fact that detection result by the line sensor lacks smoothness in changing state, visual observation or the like, the notch part is moved automatically or artificially, e.g., in the direction out of the line sensor to prevent the notch part from being detected as an outermost outer periphery edge by a known method such as rotating the wafer by an appropriate angle on the positioning device.

The line sensor used for the invention may be a transmissive type line sensor or a reflective type line sensor. However, in order to prevent adverse effect on the semiconductor wafer of a fine electric part, the line sensor is preferably an optical line sensor, not a magnetic line sensor. As this optical line sensor, known line sensors such as one comprising a light acceptance device having a slit-shaped light acceptance window, one performing light focus by installing a hog-backed lens to a light emitting device or a light acceptance device, one using laser light, one using infrared light, and one using a CCD light acceptance device can be used. Light rays of the line sensor in the invention may be radiated perpendicular to the reference plate. However, when the transmissive type sensor is used, light rays may be radiated semi-perpendicular to the reference plate if there is some volatility, e.g., change of light intensity caused by generation of interference due to direct reflection light to the light acceptance device.

In the present invention, calibration means to high-precisely relate an eccentric amount of the disc wafer as a reference plate or a positioning target and a light acceptance amount may be incorporated into means for processing data of the line sensor, such as the foregoing calculation means. Further, a rotation angle sensor, such as a rotary encoder etc., may be used in order to accurately detect a rotation angle of the reference plate around the foregoing rotation axis.

It is not necessary to perform the positioning method of the invention every wafer positioning time. It is possible to install a program in a controller in the wafer positioning device to perform the positioning method of the invention after assembling the wafer positioning device, after replacing the line sensor or the like. When a program is installed as above, for example, in the case that a detection line of the line sensor is deviated due to some accident, operation continues without irregular stop, and that a final stop position of the wafer seat rotation axis of the positioning device is not within a certain reference zone, the controller can automatically cause the wafer seat drive means and the calculation means to perform the positioning method of the invention. The positioning method can be operated by the direction from an operator etc., as a first recovery process after detection of disorder of the positioning device.

Meanwhile, a wafer positioning device of the invention is a wafer positioning device comprising: a line sensor; a wafer seat capable of laying a wafer; wafer seat drive means capable of moving the wafer seat at least in a one dimensional direction, i.e., a one dimensional direction (e.g., X axis), two dimensional directions (e.g., X axis and Y axis), or three dimensional directions (e.g., X axis, Y axis, and Z axis), and rotating the wafer seat around a given rotation axis (e.g., 0 axis); and calculation means, the wafer positioning device performing positioning of the wafer by moving a wafer center point to a given position by the wafer seat drive means through a process to calculate a wafer center point position by the calculation means based on a rotation angle of the wafer seat and detection results of an outer periphery edge of the circular wafer lying on the wafer seat by the line sensor, wherein the wafer seat drive means moves, without rotation, the wafer seat on which a reference plate lies along a second straight line (e.g., X axis) perpendicular to the first straight line so that the rotation axis turns back and passes twice or more between two points sandwiching a position of the rotation axis of the wafer seat when the line sensor detects an outermost outer periphery edge of the reference plate in a direction of the first straight line, rotates the wafer seat by a given angle except for 360° and its multiples around the rotation axis when turning back the wafer seat at one or both of the two points, or at points outside the two points, and moves the rotation axis to an intersection point position between the second straight line and the first straight line which is calculated by the calculation means, thus positioning the rotation axis on the first straight line, and the calculation means geometrically calculates the intersection point position between the second straight line and the first straight line based on data which the line sensor obtains when the reference plate passes without rotation the line sensor twice or more by the turnback movement of the wafer seat and the rotation angle.

According to the wafer positioning device of the invention, the foregoing wafer seat rotation axis positioning method of the invention can be performed. Therefore, a rotation axis of the wafer seat can be accurately positioned on the center line of the line sensor, and precision of the wafer positioning based on the subsequent wafer position detection operation can be improved. In addition, maintenance free of the wafer positioning device can be attained.

When an angle at which the wafer is rotated by the wafer seat drive means is set to 90° or 180° in the wafer positioning device of the invention, trigonometric function calculation becomes unnecessary as mentioned below. Particularly, in the case of 180°, calculation of the position difference of the outermost outer periphery edge becomes unnecessary. Therefore, this angle is preferable since calculation is easy, load on the calculation means is little, and calculation speed becomes high.

BEST MODE FOR CARRYING OUT THE INVENTION

Figure 1:
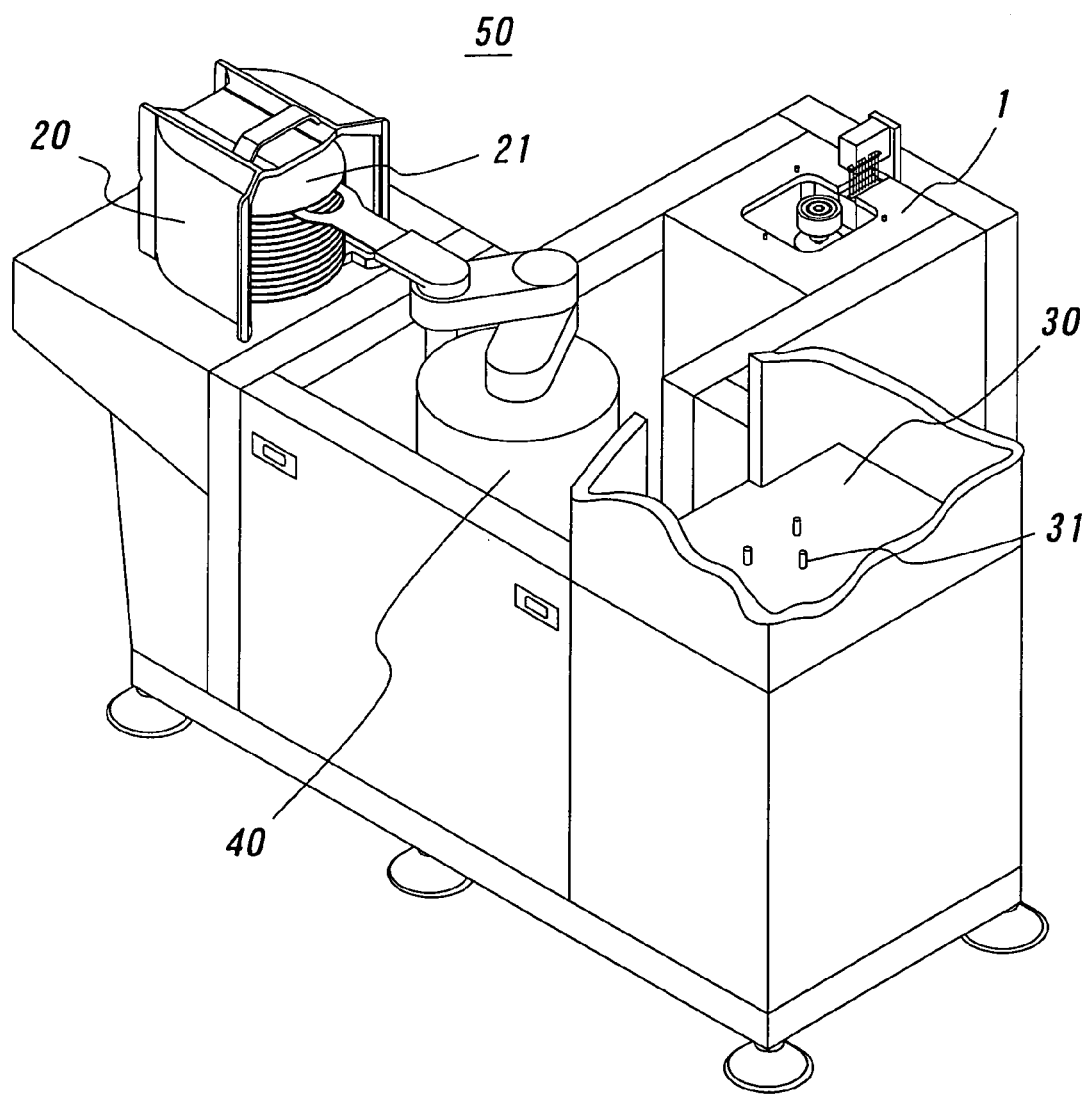
FIG. 1 is a partially sectioned perspective view, which shows a wafer process system incorporating an example of a wafer positioning device of the invention using an example of a wafer positioning method of the invention and an example of a wafer seat rotation axis positioning method of the invention.

Detailed descriptions will be hereinafter given of an embodiment of the invention by taking examples based on the drawings. FIG. 1 is a partially sectioned perspective view showing a wafer process system incorporating an example of a wafer positioning device of the invention in which an example of a wafer positioning method of the invention is used. As shown in FIG. 1, a wafer positioning device 1 is arranged adjacently to a regular wafer transport device 40 constituted by an industrial robot etc., and a regular wafer process device 30 performing an etching process etc. of a wafer. The wafer positioning device 1, the wafer transport device 40, and the wafer process device 30 constitute a wafer process system 50, an example of wafer process systems of the invention. The wafer positioning device 1 performs positioning of an orientation and a center point position of a wafer 21, when the wafer 21 is transferred from a wafer cassette 20, a clean container housing the wafers 21 on shelves thereof to the wafer process device 30 by the wafer transport device 40.

The wafer transport device 40, the wafer process device 30, and the wafer positioning device 1 each comprise unshown regular controller having a computer, for example. The wafer process system 50 also has an unshown host controller having a computer, for example, in order to control the respective controllers to cooperatively operate the wafer transport device 40, the wafer process device 30, and the wafer positioning device 1. Note that it is possible to prevent foreign materials from adhering to the wafer, by sectioning with a cover respective areas where the wafer transport device 40, the wafer process device 30, and the wafer positioning device 1 are placed, providing a fan filter unit on the sealing part of the cover, and providing a highly clean area generally called a mini-environment within the cover.

Figure 2:
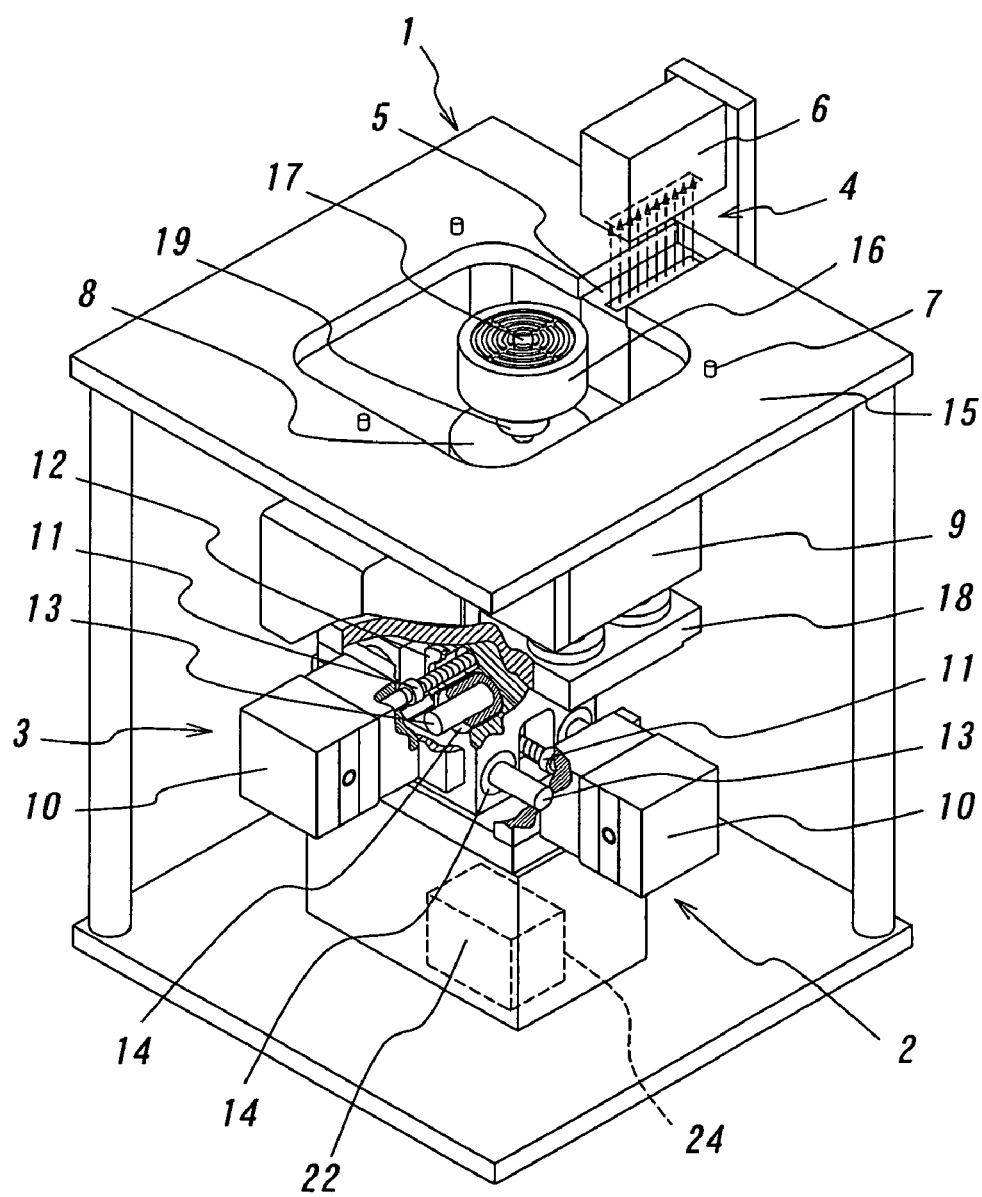
FIG. 2 is a perspective view, which shows the wafer positioning device of the foregoing example without a cover.

As shown in FIG. 2, the wafer positioning device 1 of the foregoing example comprises an upper plate 15 where a wafer temporary platform 7 is provided at the upper part of the device 1; and an X axis movement mechanism 2 and a Y axis movement mechanism 3, which are two orthogonal linear movement mechanisms at the lower part of the device 1. A bracket 18, which is arranged below the upper plate 15, can be moved on the horizontal X-Y plane by the X axis movement mechanism 2 and the Y axis movement mechanism 3. Moreover, the wafer positioning device 1 of the foregoing example comprises a motor 8 to rotate the wafer, which is supported by the bracket 18 with an elevation mechanism 9 inbetween. An output shaft of the motor 8 extending in the Z axis direction whose rotation axis is vertical is directly coupled to a rotational shaft 19 provided under a spindle 16 as a wafer seat on which the wafer lies horizontally.

The X axis movement mechanism 2 comprises a motor 10 fixed on a base 22; a ball screw shaft 11 which is directly rotated by the motor 10 and of which both ends are rotatably supported by the base 22 in a posture that its axis extends from the rear left to the front right in FIG. 2; a ball nut 12, which is screwed together with the ball screw shaft 11 and moves by rotation of the ball screw shaft 11 in the X axis direction extending from the rear left to the front right in FIG. 2; a slide guide 13 fixed over the base 22, which guides linear movement in the X axis direction; a slide bearing 14, which slides along the slide guide 13; and a movement block in the shape of an approximately rectangular solid on which the ball nut 12 and the slide bearing 14 are fixed.

The Y axis movement mechanism 3 orthogonal to the X axis direction comprises as in the X axis movement mechanism 2, a motor 10 fixed on the movement block; a ball screw shaft 11 directly rotated by the motor 10, whose both ends are rotatably supported by the movement block in a posture that its axis extends from the front left to the rear right in FIG. 2; a ball nut 12, which is screwed together with the ball screw shaft 11 and moves by rotation of the ball screw shaft 11 in the Y axis direction extending from the front left to the rear right in FIG. 2; a slide guide 13 fixed on the movement block, which guides linear movement in the Y axis direction; a slide bearing 14, which slides along the slide guide 13; and the bracket 18, on which the ball nut 12 and the slide bearing 14 are fixed.

The elevating mechanism 9 is constructed as in the X axis drive mechanism 2 and the Y axis drive mechanism 3. The elevating mechanism 9 can move or elevates the motor 8 supporting the spindle 16 with the rotation axis 19 inbetween in the Z axis direction. The spindle 16 has a lot of vacuum holes 17 to-pick up and support the wafer placed thereon horizontally. Therefore, the X axis drive mechanism 2, the Y axis drive mechanism 3, the elevating mechanism 9, and the motor 8 constitute wafer seat drive means.

Figure 3:
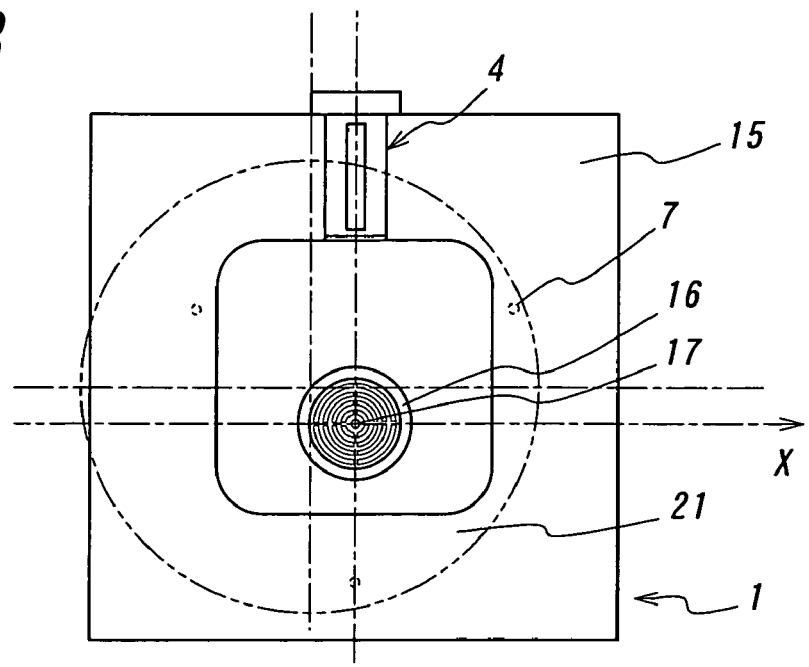
FIG. 3 is a plan view of the wafer positioning device of the foregoing example.

FIG. 3 is a plan view the wafer positioning device 1 of the foregoing example which is seen from the above. As shown in FIGS. 2 and 3, the wafer positioning device 1 of this example comprises a line sensor 4 which sandwiches from above and beneath a peripheral part of the wafer 21 on the spindle 16 at a part of a notch part of the upper plate 15. This line sensor 4 comprises a light emitting device 5 having a straight through light emitting part and a light acceptance device 6 having a straight through light acceptance part so that the light emitting device 5 below the wafer 21 and the light acceptance device 6 above the wafer 21 are facing to each other. An extending direction of the light emitting part and the light acceptance part is set to be perpendicular to the movement direction of the spindle 16 or the wafer 21 by the X axis direction movement mechanism 2. In this line sensor 4, an eccentric amount of a wafer outer periphery edge in relation to the rotation axis of the spindle 16 is measured as a light shielding length (one-dimensional amount) when known light such as laser light and LED light emitted from the lower light emitting device 5 along the light emitting part is shielded by the wafer by using the light acceptance device 6 installed facing to the light emitting device 5. A measurement value by the light acceptance device 6 is transmitted as a signal to a controller 24 of the device 1 of this example, which is calculating means housed in the base 22 positioned below the X axis movement mechanism 2.

Figure 4:
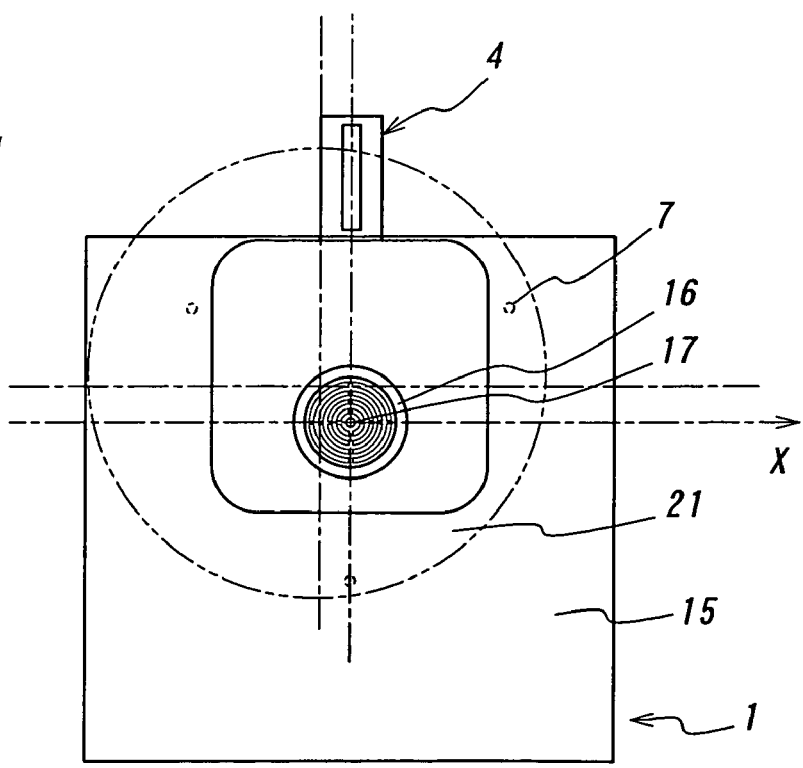
FIG. 4 is a plan view of other example of the wafer positioning device of the invention, wherein arrangement of a line sensor is different.

FIG. 4 is a plan view showing other example of the wafer positioning device of the invention which is seen from the above and in which the line sensor 4 is additionally provided at the side part of the upper plate 15. In the wafer positioning device 1 shown in FIG. 3 or 4, generally, the wafer 21 is laid on the spindle 16 by the wafer transport device 40 in the state that the wafer 21 is eccentric in relation to the rotation axis of the spindle 16. Therefore, in the wafer positioning device 1, an eccentric amount is detected by rotating the wafer 21 on the spindle 16. In addition, the wafer 21 is horizontally moved so that an actual center point position of the wafer 21 is positioned at the appropriate wafer center point position, and the wafer 21 is rotated so that its actual notch part position is positioned at the appropriate notch part position, by the controller 24.

Figure 5A:
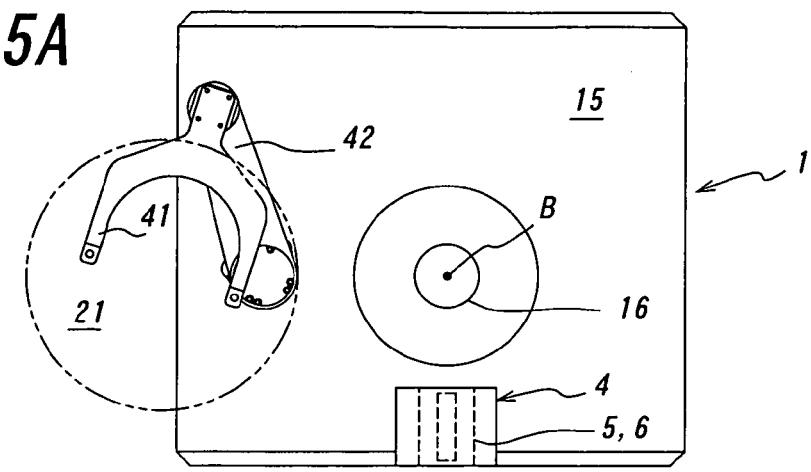
FIGS. 5A, 5B, and 5C are a plan view, a front view, and a side view, which show still other example of the wafer positioning device of the invention.
Figure 5B:
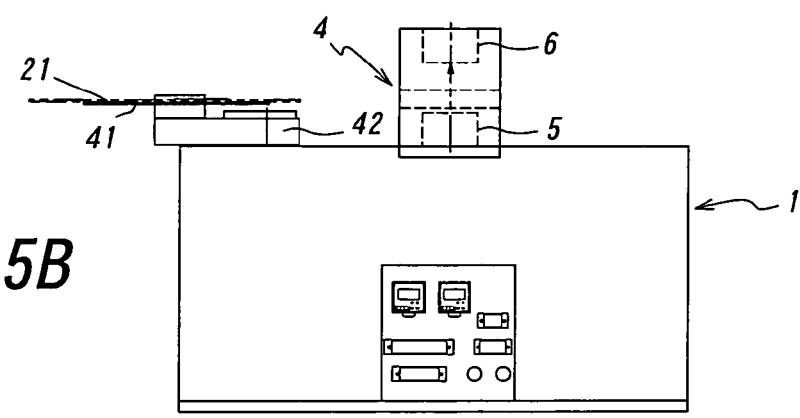
Figure 5C:
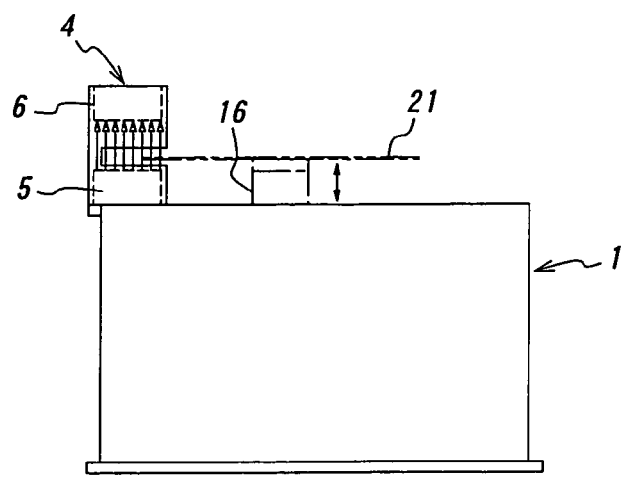

FIGS. 5A, 5B, and 5C are a plan view, a front view, and a side view, which show still other example of the wafer positioning device of the invention. The wafer positioning device 1 of this example has a construction similar to that of the foregoing example, and comprises an arm 42 and fingers 41 for wafer transport use; and an unshown regular drive mechanism as drive means for the arm and the fingers, which moves the arm 42 and the fingers 41 horizontally and two dimensionally as the regular wafer transport device 40. In this case, handing over of the wafer is performed by driving the spindle 16 as a wafer seat up and down by the elevating mechanism as shown in the figure.

Figure 6:
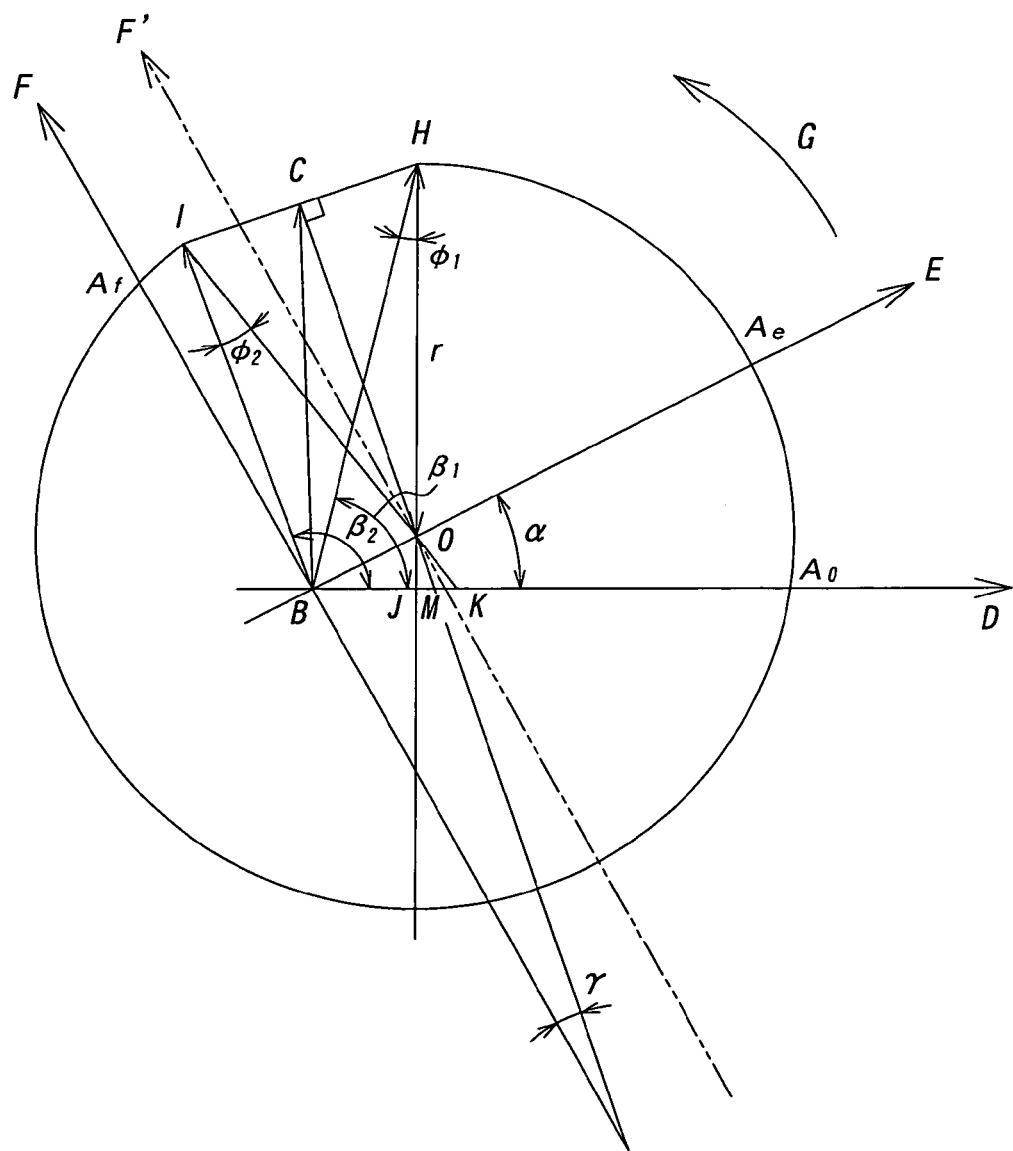
FIG. 6 is an explanation drawing, which shows a geometrical method to obtain a position of a wafer center point and an orientation of a notch or an OF in relation to a rotation axis of a spindle in the wafer positioning method of the foregoing example.
Figure 7:
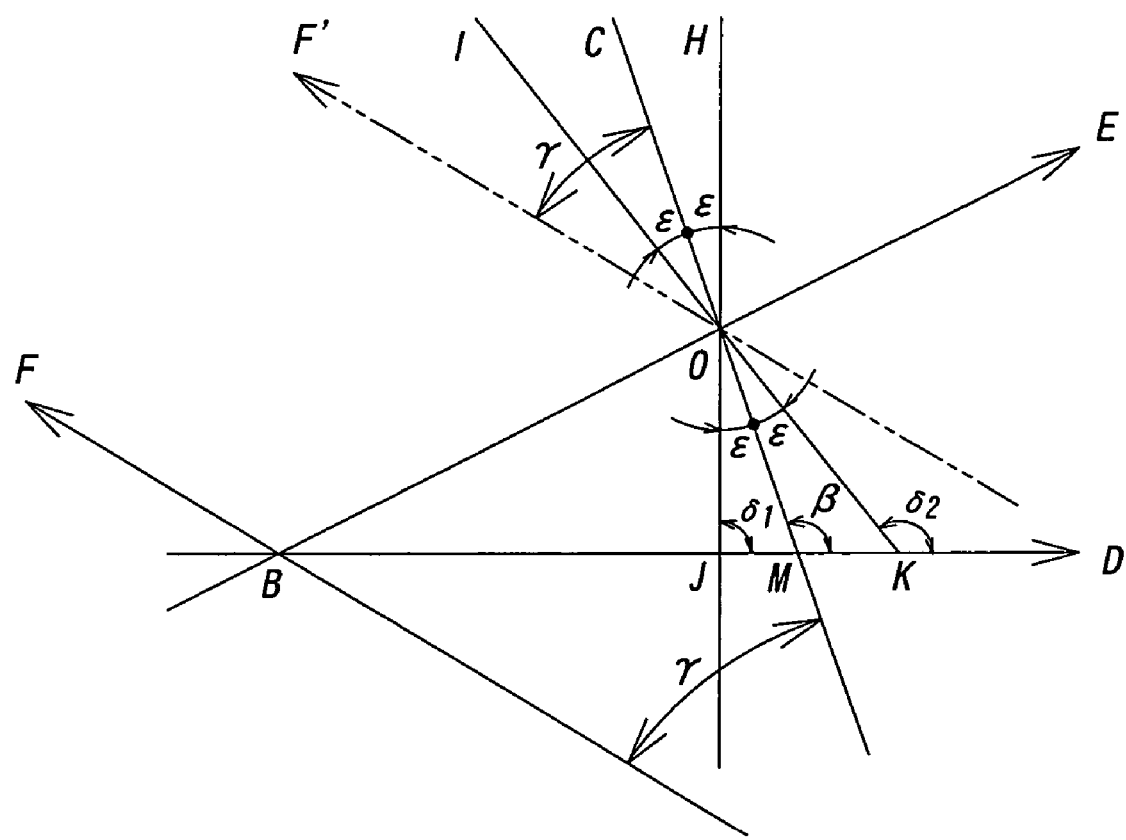
FIG. 7 is an explanation drawing, wherein a part in the vicinity of the center of FIG. 6 is expanded.

FIGS. 6 and 7 are explanation views, which show a geometrical method to obtain a position of a wafer center point O and an orientation of a notch or an OF (orientation flat) in relation to a rotation axis B of the spindle 16 in the positioning method of the foregoing example. Meanings of symbols in these figures are as follows:

O: the center of the wafer

B: the rotation axis of the spindle 16

C: the center of a notch or an OF of the wafer

D: an initial extending direction of a center part of the line sensor 4 before relative rotation of the line sensor 4 in relation to the wafer, which is seen from the rotation axis of the spindle 16. Hereinafter, this direction is referred to as "reference direction." A straight line which extends in this extending direction initially and then rotates in relation to the wafer along with relative rotation of the line sensor 4, is referred to as "reference line."

E: a direction wherein an eccentric radius (distance between the rotation axis of the spindle 16 and the outer periphery edge of the wafer) becomes maximum or minimum, seen from the rotation axis of the spindle 16.

F: a direction of the line sensor 4 seen from the rotation axis of the spindle 16, when the notch is oriented to a designated direction (given direction).

G: a direction of relative rotation of the line sensor 4 in relation to the wafer, where the line sensor 4 is seen from a position on the wafer.

Figure 10:
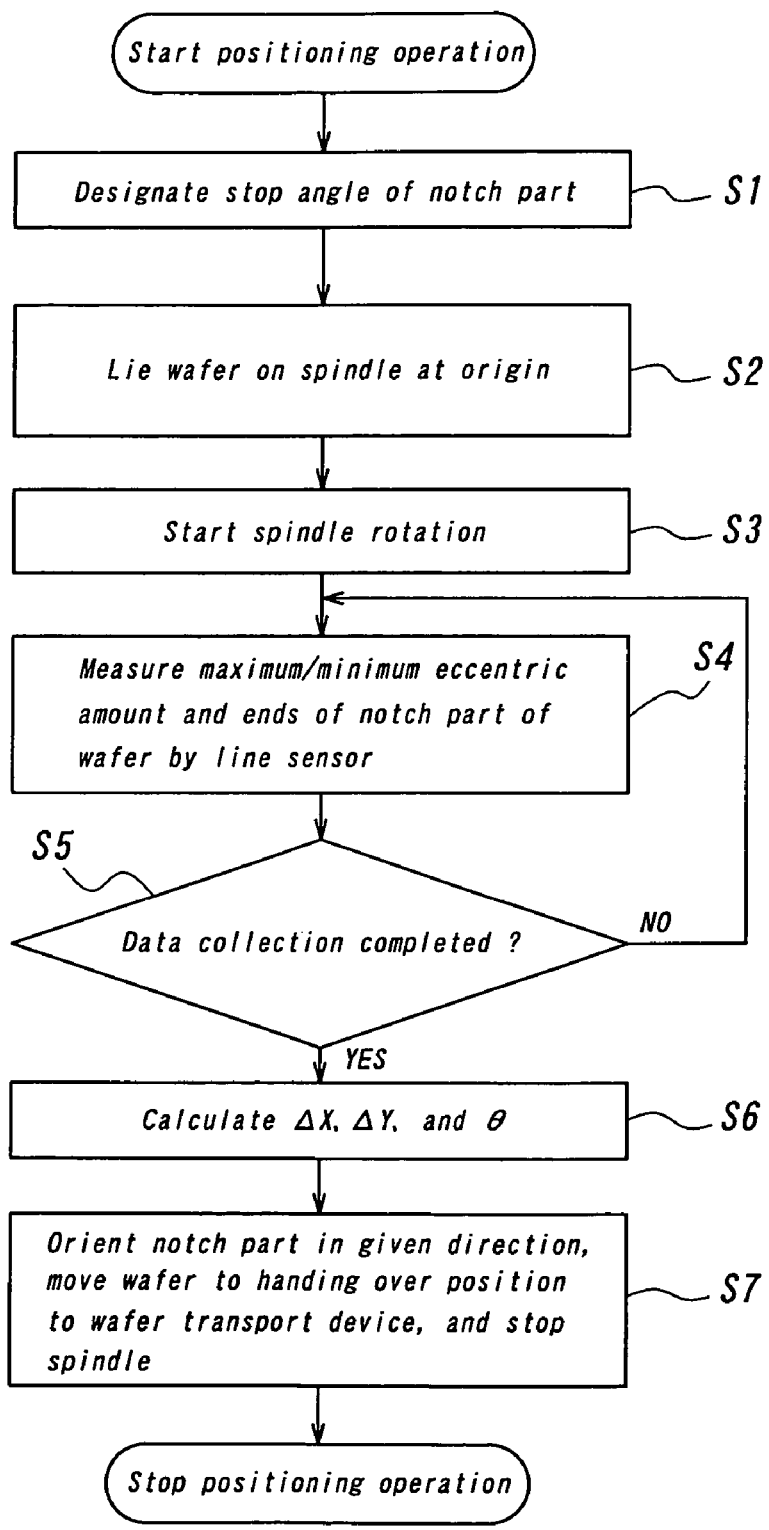
FIG. 10 is a flow chart, which shows a procedure for the wafer positioning method of the foregoing example.

Descriptions will be given of a procedure for the wafer positioning method of the foregoing example implemented by the controller as the calculating means for the wafer positioning device based on a program previously given, with reference to a flow chart shown in FIG. 10. First, in Step S1, a stop angle of the notch part is inputted and designated. Next, in Step S2, a wafer is laid on the spindle 16 of the wafer positioning device 1 by the fingers of the wafer transport device 1 or the wafer positioning device shown in FIG. 5A etc. Simultaneously, the wafer is picked up and supported by the spindle 16. It is desirable that the center point of the wafer is on the rotation axis of the spindle 16. However, when observed in detail, the wafer is generally eccentric.

Next, in Step S3, the spindle 16 is driven by the motor 8 based on a direction from the controller to start rotation. The line sensor 4 is shielded by an outer periphery edge of the wafer laid on the spindle 16. The line sensor 4 transmits information on a light shielding amount as an electric signal to the controller. The controller thereby checks whether the wafer outer periphery edge is within the measurable range which has been previously determined. If not, the wafer is retaken up and relocated on the appropriate position. If within the measurable range, a referential origin data is collected. The procedure goes to the next step.

Next, in Step S4, the spindle 16 is rotated by the motor 8 based on the direction from the controller. While the rotation of the spindle 16, the line sensor 4 is operated to convert the light shielding amount by the wafer to an electric signal. The line sensor 4 measures data to calculate the maximum or the minimum eccentric radius Lm, an angle a thereto, and angles $\beta_1$ and $\beta_2$ for the both ends of the OF or the notch, and sends the data to the controller. In Step S5, the controller thereby checks whether the data necessary for above-mentioned Expressions (1) to (7) is collected or not. If not, the procedure goes back to Step S4 to take data again. If collected, the procedure goes to the next step.

Next, in Step S6, based on the data sent from the line sensor 4 and the rotation angle of the spindle 16 by the motor 8, the controller calculates an eccentric amount d from Expression (1), calculates the angles $\beta_1$ and $\beta_2$ from Expressions (6) and (7) respectively, and then calculates a rotational angle θ from Expression (2), an X axis direction movement distance ΔX from Expression (3), and a Y axis direction movement distance ΔY from Expression (4). After that, in Step S7, directions from the controller are sent to the X axis drive mechanism 2, the Y axis drive mechanism 3, and the motor 8. According to the directions, the X axis drive mechanism 2, the Y axis drive mechanism 3, and the motor 8 move the spindle 16 so that the rotation axis of the spindle 16 is positioned at a given position (wafer handing over position to the wafer transport device 40), and stop the rotation of the spindle 16 at a given angle to orient the notch part of the wafer in a given direction. The positioning operation is thereby finished.

Descriptions will be given in detail of the calculation method in the foregoing Step S6. In FIG. 6, from the reference line D, that is a line drawn from an intersection point $A_0$ between the line sensor 4 and the wafer outer periphery edge when the motor 8 is starting operation to the rotation axis B, the motor starts operation, and the line sensor 4 measures the outer periphery edge of the wafer every unshown fine angle λ. In this regard, the intersection points between the line sensor 4 and the wafer outer periphery edge are sequentially referred to as $A_1$ to $A_n$. Respective distances between the rotation axis B of the spindle 16 and the foregoing $A_0$ to $A_n$ are converted into eccentric radii $L_0$ to $L_n$. A rotational angle θ represents an angle made by the reference line which passes through the rotation axis B of the spindle 16 and the center part of the line sensor 4 and which extends in the extending direction thereof at the position where the wafer is initially laid on the spindle 16, and a straight line which passes through the center part of the line sensor 4 and which extends in the extending direction thereof at the position where the reference line is to be finally stopped after rotation in relation to the wafer along with rotation of the wafer seat or the wafer (where the notch part is oriented in a given direction).

The controller accumulates and calculates information on the eccentric radii $L_0$ to $L_n$ of the wafer, and also calculates and stores the positions $\beta_1$ and $\beta_2$ of the notch or the OF detected by the line sensor 4. The controller calculates a deviance distance (eccentric distance) d between the eccentric center (wafer seat rotation axis) and the wafer center point from the maximum or minimum eccentric radius Lm for positions other than the notch or the OF, and finds the rotation angle α at that time. Here, in the case of the maximum eccentric radius, d becomes positive, and in the case of the minimum eccentric radius, d becomes negative. It is enough to detect one of them.

A maximum or minimum eccentric wafer outer periphery point $A_e$ can be detected by selecting the maximum or minimum eccentric measurement value from the measurement values $L_0$ to $L_n$ obtained for every certain fine angle λ, and the $A_e$ thereof. That is, the center point O of the wafer and the rotation axis B are on the straight line E where the eccentric radius is the maximum or the minimum. The maximum or minimum eccentric measurement value Lm selected from the measurement values $L_0$ to $L_n$ appears on the measurement point $A_e$. Therefore, the eccentric distance (eccentric amount) d of the wafer can be calculated by comparing Lm to a known wafer radius r, and obtaining a difference as d=Lm−r. When it is clarified that the maximum eccentric wafer outer periphery point is at the notch part from change of the measurement values before and after the detected maximum eccentric wafer outer periphery point, the eccentric amount d is calculated by using a measurement value of the minimum eccentric wafer outer periphery point. Meanwhile, when it is clarified that the minimum eccentric wafer outer periphery point is at the notch part from change of the measurement values before and after the detected minimum eccentric wafer outer periphery point, the eccentric amount d is calculated by using a measurement value of the maximum eccentric wafer outer periphery point.

Movement distances to the wafer handing over position is found from the eccentric amount d, which is a deviance between the rotation axis B and the center point O of the wafer. Where coordinates of the rotation axis B is ($X_b$, $Y_b$), and coordinates of the center point O of the wafer is ($X_O$, $Y_O$) as positions on the X-Y coordinates, the eccentric amount d is expressed as follows:

$$\Delta X = X_b - X_O = d \sin(\theta - \alpha) \qquad (3)$$

$$\Delta Y = Y_b - Y_O = d \sin(\theta - \alpha) \qquad (4)$$

A distance that the wafer positioning device 1 moves the center point of the wafer when the wafer is handed over to the wafer transport device 40 is as shown in Expressions (3) and (4). As an actual operation, the rotation axis B is moved to the coordinates ($X_b$, $Y_b$) in order to adjust a position of the coordinates of the center point of the wafer ($X_O$, $Y_O$) to the front of the line sensor for handing the wafer over to the wafer transport device 40.

$$X_b = X_O - d \sin(\theta - \alpha)$$

$$Y_b = Y_O - d \sin(\theta - \alpha)$$

Figure 8:
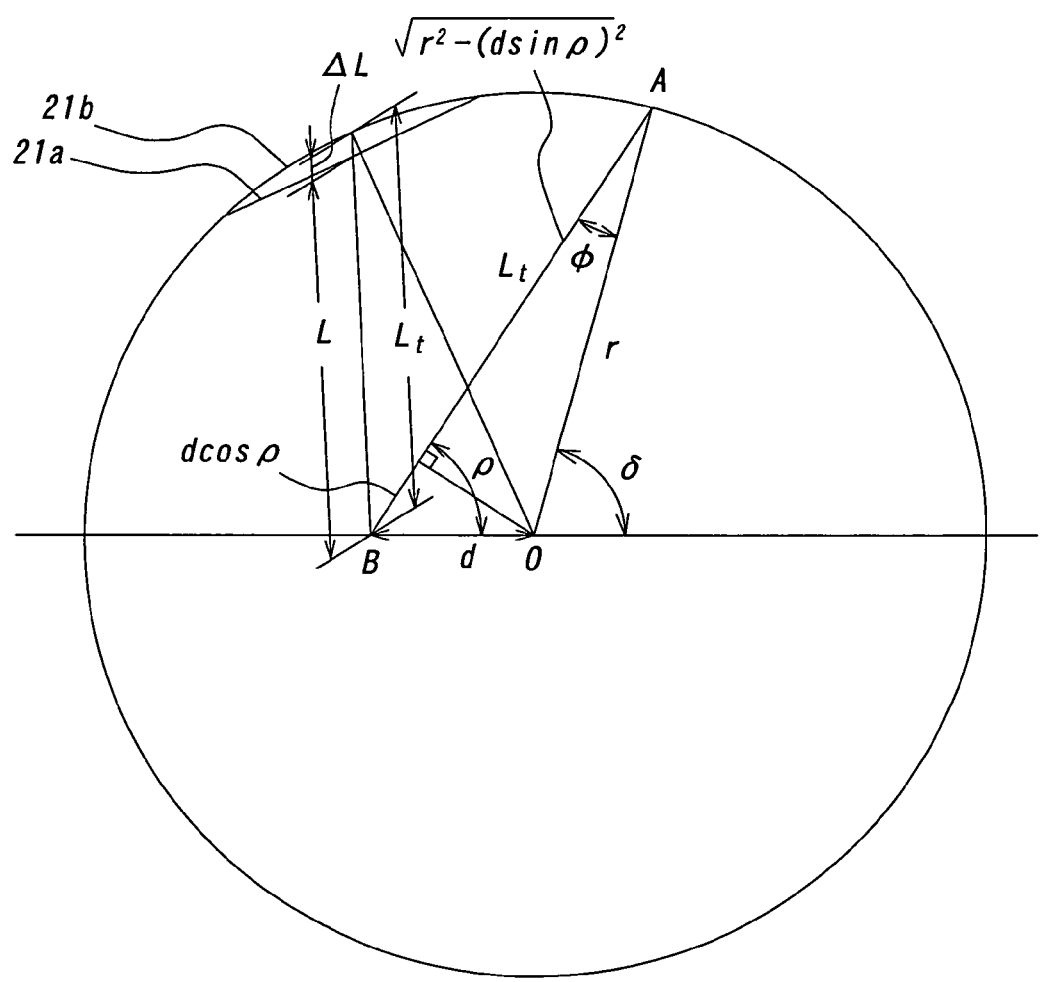
FIG. 8 is an explanation drawing, which shows a geometrical method to find the orientation of the notch or the OF in relation to the rotation axis of the spindle in the wafer positioning method of the foregoing example.

Next, descriptions will be given of a method to calculate a position of an OF or a notch based on a group of information on measurement values obtained from the line sensor 4, with reference to a disc 21b with no notch part in FIG. 8. When a theoretical distance from the rotation axis B to an outer periphery edge A is $L_t$, the following expression can be geometrically expressed:

$$r^2 = (L_t \cos \rho - d)^2 + (L_t \sin \rho)^2 = d^2 + L_t^2 - 2dL_t \cos \rho$$

$L_t$ can be found by the following expression:

$$L_t = d \cos \rho + (r^2 - d^2 \sin^2 \rho)^{1/2}$$

Figure 9:
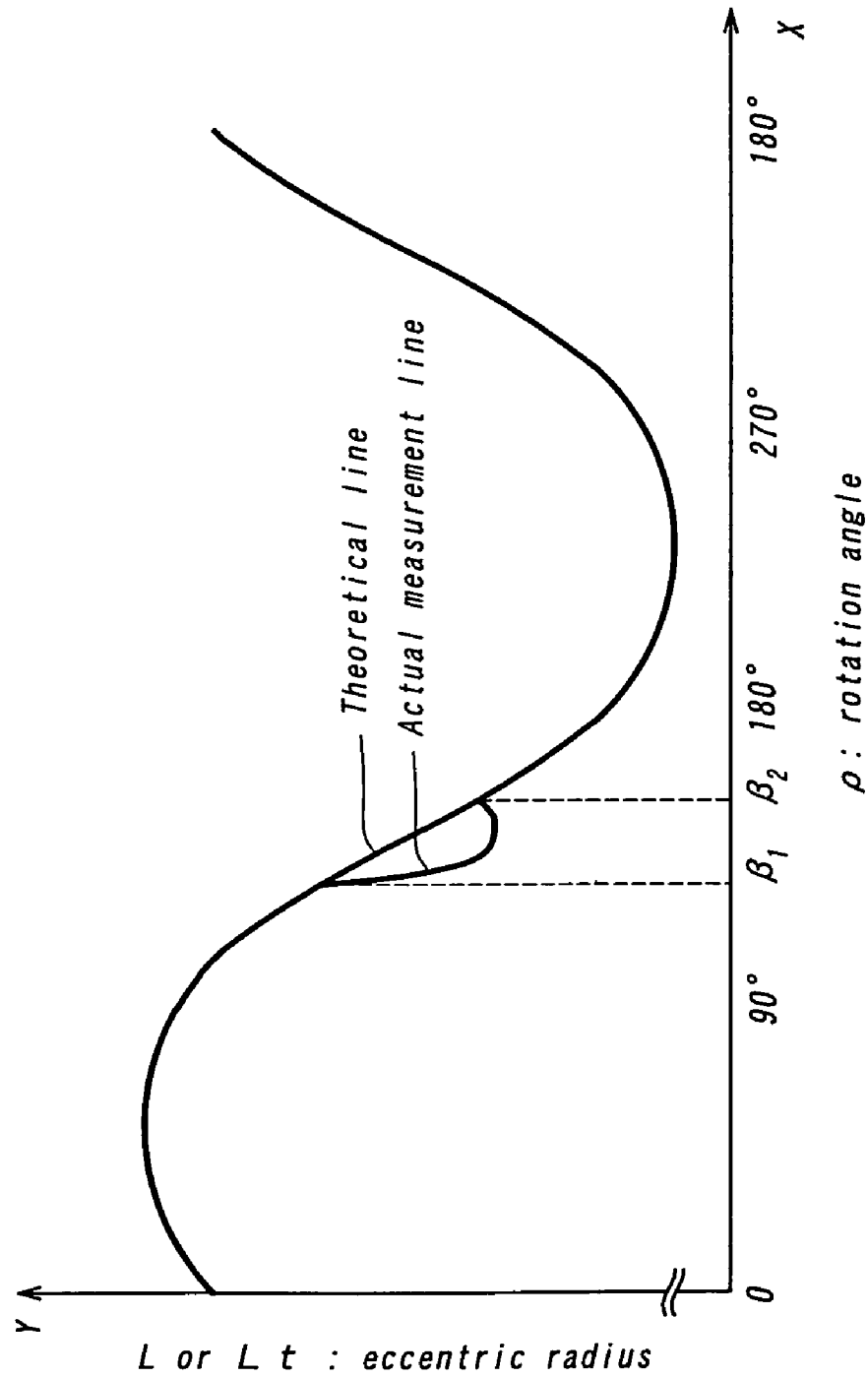
FIG. 9 is a relation diagram between eccentric radii and rotational angles, which shows an actual measurement line drawn by a wafer outer periphery edge having an OF, and a theoretical line drawn by a disc.

This theoretical expression is shown diagrammatically in FIG. 9.

L (measurement value) of an actual wafer is different from the theoretical value as for the notch part 21a. Therefore, points of $L_t \neq L$ are selected from the group of information detected by the line sensor 4. A start point and a final point in the range of these points are recognized as end points H and I of the notch part in FIG. 6, and their angles are denoted by $\beta_1$ and $\beta_2$. That is, for the start point, the angle $\beta_1$ is obtained where the value of $\Delta L_1 = L_t - L$ is 0 when the value is changing from 0 to a positive, and for the final point, the angle $\beta_2$ is obtained where the value of $\Delta L_2 = L_t - L$ is 0 when the value is changing from a positive to 0.

Expressions $\rho = \beta_1 - \alpha$ and $\rho = \beta_2 - \alpha$ for the both ends of the notch part derive the following Expressions (6) and (7):

$$\Delta L_1 = [d \cos(\beta_1 - \alpha) + \{r^2 - d^2 \sin^2(\beta_1 - \alpha)\}^{1/2}] - L \quad (6)$$

$$\Delta L_2 = [d \cos(\beta_2 - \alpha) + \{r^2 - d^2 \sin^2(\beta_2 - \alpha)\}^{1/2}] - L \quad (7)$$

Next, a correct center direction of the notch part such as an OF and a notch is derived theoretically. The fact that the controller recognizes that the start point and the final point of the notch part such as an OF and a notch are located at the positions which are apart from the reference line before rotation by β1 and β2, and the eccentric amount d, which is a deviance between the rotation axis B and the wafer center point O are taken into account. A designated wafer OF direction angle γ is in the direction of OF' (2-dot dashed line) in FIG. 6, or in the direction of BF parallel to OF' if seen from the rotation axis B. Descriptions will be given of a calculation method for this angle with reference to FIG. 6 and FIG. 7, which is an enlarged view of FIG. 6. That is, the straight line F is in the direction wherein the line sensor 4 exists if seen from the rotation axis B, when the wafer rotates about the rotation axis B to the designated OF direction.

As shown in FIG. 7, γ is an angle made by a straight line passing through the wafer center point O and a mid point C of the OF, and the straight line F. As mentioned above, this is a known angle previously designated. β is an angle made by the straight line passing through the wafer center point O and the mid pint C of the OF, and a straight line passing through the rotation axis B and the wafer center point O. β is calculated based on a measurement value. In FIGS. 6 and 7, $$\angle JOM = \angle KOM = \epsilon$$

then, in $\triangle OJK$, $\beta$ is expressed as the following expressions:

$$\beta = \epsilon + \delta_1 \quad (10)$$

$$\delta_2 = \epsilon + \beta \quad (11)$$

When Expression (11) is subtracted from Expression (10), the result is expressed as follows:

$$\beta = (\delta_1 + \beta_2)/2 \quad (12)$$

β is an average value of $\delta_1$ and $\delta_2$.

From $\triangle BHJ$ and $\triangle BIK$ in FIG. 6, $\delta_1$ and $\delta_2$ in FIG. 7 are expressed as the following expressions:

$$\delta_1 = \beta_1 + \phi_1 \quad (13)$$

$$\delta_2 = \beta_2 + \phi_2 \quad (14)$$

Further, in $\triangle BOH$, $\phi_1$ is expressed as $\sin \phi_1/d = \sin(\beta_1 - \alpha)/r$, and in $\triangle BIO$, $\phi_2$ is expressed as $\sin \phi_2/d = \sin(\beta_2 - \alpha)/r$, then $$\phi_1 = \arcsin \{(d/r)\sin(\beta_1 - \alpha)\} \quad (15)$$

$$\phi_2 = \arcsin \{(d/r)\sin(\beta_2 - \alpha)\} \quad (16)$$

When these Expressions (15) and (16) are assigned to Expressions (13) and (14) respectively, the following expressions are obtained:

$$\delta_1 = \beta_1 + \arcsin \{(d/r)\sin(\beta_1 - \alpha)\} \quad (17)$$

$$\delta_2 = \beta_2 + \arcsin \{(d/r)\sin(\beta_2 - \alpha)\} \quad (18)$$

From Expressions (12), (17) and (18), the following expression is obtained:

$$\beta = [\beta_1 + \beta_2 + \arcsin \{(d/r)\sin(\beta_1 - \alpha)\} + \arcsin \{(d/r)\sin(\beta_2 - \alpha)\}]/2 \quad (19)$$

From the $\theta = \beta + \gamma$ and Expression (19), θ is found as follows:

$$\theta = \gamma + [\beta_1 + \beta_2 + \arcsin \{(d/r)\sin(\beta_1 - \alpha)\} + \arcsin \{(d/r)\sin(\beta_2 - \alpha)\}]/2 \quad (2)$$

Here, in order to shorten the calculation process speed, approximation may be made. When Taylor expansion is applied to Expression (2), θ is calculated as follows by omitting the quadratic and higher terms since d/r is minor:

$$\theta \approx \gamma + [\beta_1 + \beta_2 + (d/r)\{\sin(\beta_2 - \alpha) + \sin(\beta_2 - \alpha)\}]/2 \quad (5)$$

Therefore, it becomes possible to orient the OF or the notch at the designated angle by rotating the wafer by the angle θ. An error from this approximation by Expression (5) is as follows: for the wafer of 300 mm, when d is 2 mm, a run-out of θ is about 0.00009°, and when d is 5 mm, a run-out of θ is about 0.0002°. Therefore, though Expression (5) is an approximate expression, its error is very small, and there is no problem in practical use.

As above, a series of the wafer positioning calculation operation by the controller is finished while the wafer is rotating. Then, the controller sends an direction signal to the X axis movement mechanism 2, the Y axis movement mechanism 3, and the motor 8, rotates the spindle 16 by θ based on Expression (2) or (5), moves the rotation axis B to the coordinates ($X_b$, $Y_b$) by moving the spindle 16 based on Expressions (3) and (4), and then stops the movement and rotation. These three operations before stop are preferably performed simultaneously, but can be performed in a given order.

After that, the controller stops the pick-up vacuum. The wafer is handed over to the fingers of the wafer transport device 40, and transported to the wafer process device 30, the clean container 20 or the like. The wafer center point is thereby moved to the wafer handing over position to the wafer transport device 40, and the OF or the notch of the wafer is oriented at the designated angle. Through this series of procedure, the wafer positioning operation is performed and finished very speedy and accurately.

As above, according to the method and the device of the foregoing example, very accurate positioning can be performed by firstly deriving the theoretical expression of the eccentric rotation of the circular wafer and the theoretical position of the center of the OF or the notch at the wafer outer periphery edge. Further, it has been found that when the approximate expression is partly used instead of the theoretical expression, the error is very small and there is no problem in practical use. Furthermore, results can be obtained before the first rotation of the wafer, since either the maximum or minimum eccentric radius and the angle thereof, and the data on angles for the both ends of the OF or the notch are only obtained during wafer rotation. For example, as shown in FIG. 9, when the maximum value and the OF appear at about 110°, data collection is finished at wafer rotation angle of 120°. Therefore, the calculation is finished during wafer rotation, and rotating the wafer to a given angle can be performed within one rotation of the wafer. In result, positioning can be performed in a very short period. Needless to say, it is not necessary to retake up the wafer during the positioning operation. Consequently, a positioning time of only 1.5 sec. to 1.7 sec. from the start of the spindle rotation, which is ½ to ⅓ of the conventional time, has been thereby attained.

Incidentally, as a rule, the extending direction of the light emitting part and light acceptance part of the line sensor 4 is set to be perpendicular to the movement direction of the spindle 16 or the wafer 21 by the X axis movement mechanism 2. However, in the case of after-replacement of the line sensor 4, after-repair of the movement mechanisms 2 and 3 or the like, there is a possibility that the extending direction or the position of the light emitting part and the light acceptance part of the line sensor 4 is out of alignment from the original state. In this case, in order to improve positioning precision, before performing positioning of the wafer 21 laid on the spindle 16, positioning operation for the rotation axis of the spindle 16 is performed following the procedure shown in the flow chart of FIG. 16 by using the wafer seat rotation axis positioning method of the foregoing example, and the rotation axis of the spindle 16 is accurately positioned on the line perpendicular to the X axis (line parallel to the Y axis), which passes through the center part of the light acceptance part of the line sensor 4 and extends in the extending direction thereof.

Figure 11A:
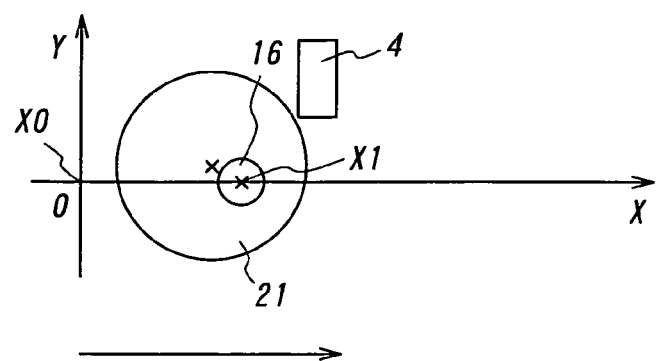
FIGS. 11A, 11B, and 11C are explanation drawings, which show operation states of the device of the foregoing example in a method of an example in which a rotation angle is 180°.
Figure 16:
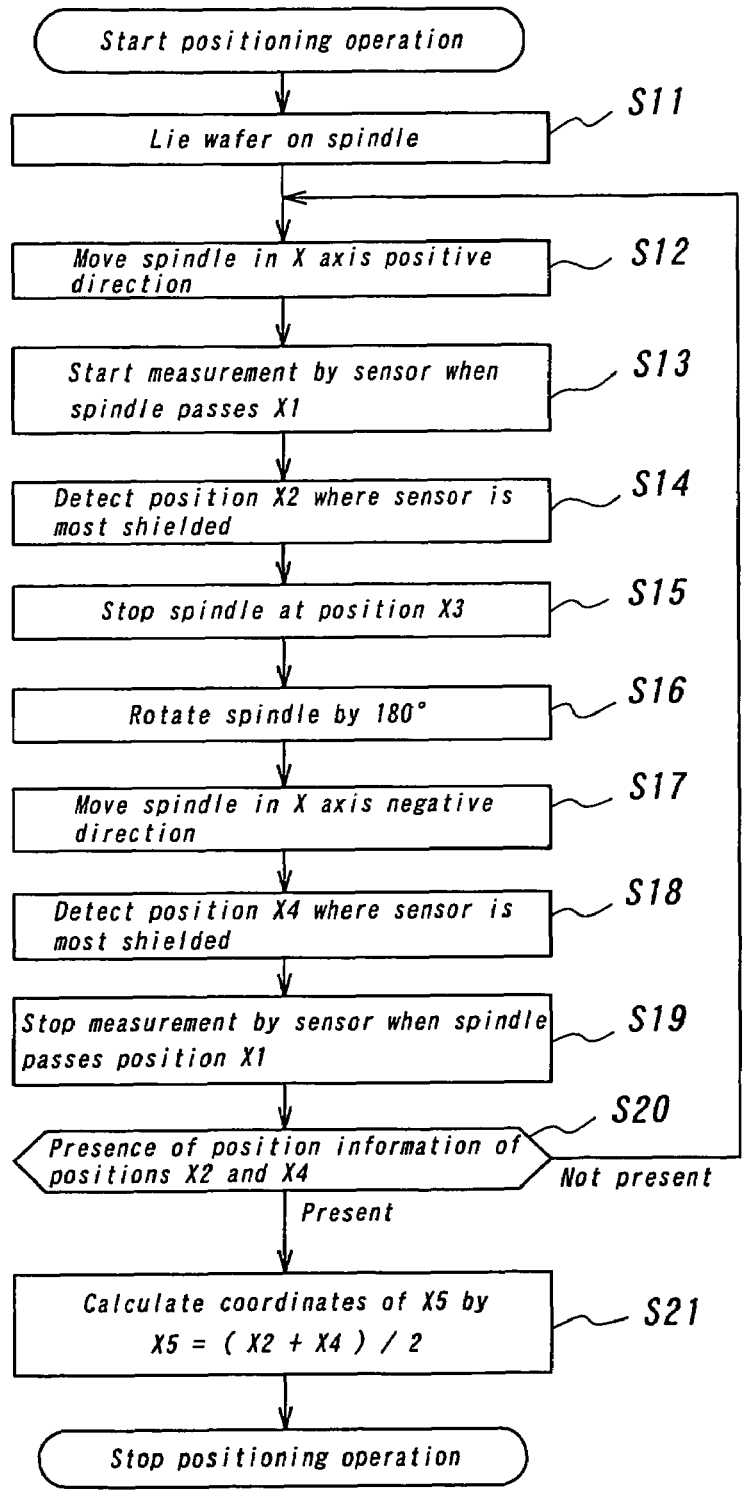
FIG. 16 is a flow chart, which shows a procedure for the method of the example in which a rotation angle is 180° in the device of the foregoing example.

The procedure shown in FIG. 16 is implemented by the controller 24 for the wafer positioning device 1 of the foregoing example based on a program previously given. Here, the wafer 21, which is substantially a disc having a slight notch part is used as a reference plate. First, in Step S11, the wafer 21 taken out from the cassette 20 and transported by the wafer transport device 40 is laid on the spindle 16. The wafer is picked up and supported by the spindle 16. At that time, by using the X axis direction movement mechanism 2 and the Y axis direction movement mechanism 3 of the wafer positioning device 1, the rotation axis of the spindle 16 is positioned at X0 on the X axis, which is an origin of the coordinate system shown in FIGS. 11A, 11B, and 11C. This position is referred to as the origin X0 (0, 0). When the spindle 16 is moved in the respective directions of the X axis and the Y axis, the distances are measured based on this origin.

Figure 11B:
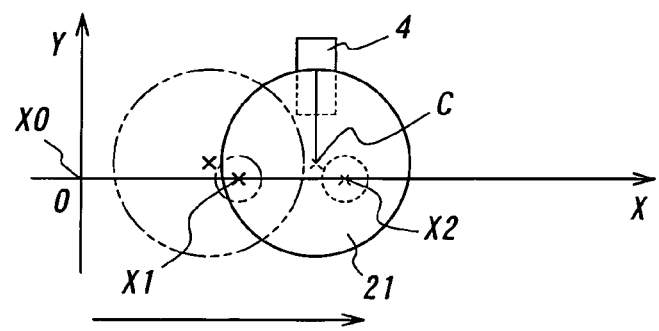

After that, in Step S12, the wafer 21 is moved in the X axis positive direction without rotation by operating the X axis direction movement mechanism 2 by the controller 24 of the wafer positioning device 1. In Step S13, while taking data of the outer periphery edge of the wafer 21 by the line sensor 4 from when the rotation axis of the spindle 16 passes through the previously given point X1 (X1, 0) shown in FIG. 11A, the wafer 21 is moved to another previously given point X3 (X3, 0) shown in FIG. 11C. During such a movement, in Step S14, the rotation axis position X2 (X2, 0) of the spindle 16 where the line sensor 4 is most shielded as shown in FIG. 11B (time of detecting the outermost outer periphery edge) by letting through the outer periphery edge of the wafer 21 picked up and supported by the spindle 16 within the detection range of the line sensor 4 is detected, and temporarily stored by storage means.

Figure 11C:
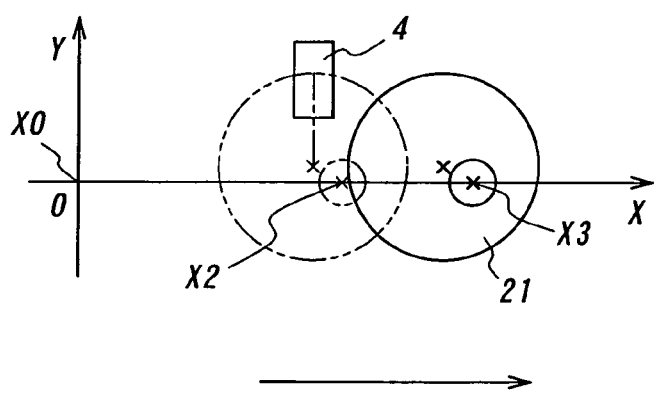
Figure 12A:
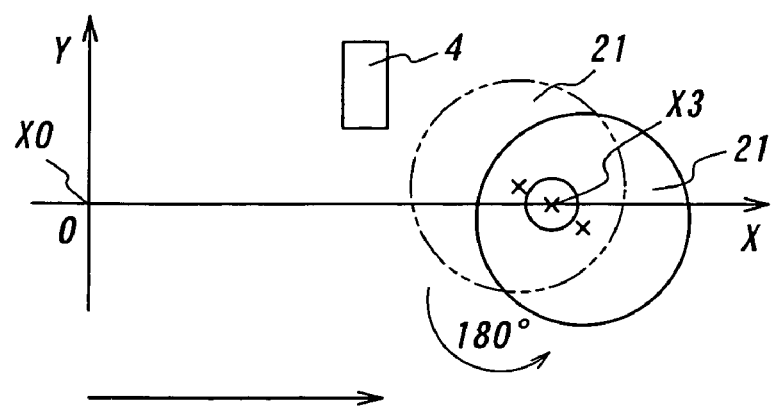
FIGS. 12A, 12B, and 12C are explanation drawings, which show operation states of the device of the foregoing example in the method of the example in which a rotation angle is 180°.
Figure 12B:
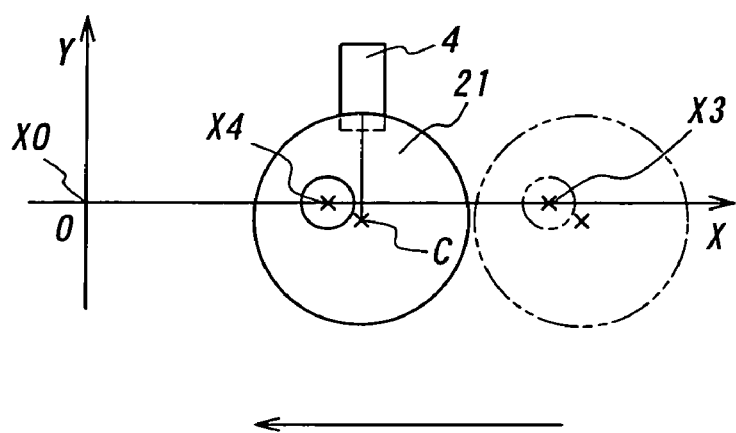

In Step S15, movement of the spindle 16 is stopped at the position of the point X3 (X3, 0) shown in FIG. 11C. Subsequently, in Step S16, as shown in FIG. 12A, the spindle 16 is rotated by 180° in this example by the motor 8 while picking up and supporting the wafer 21.

Figure 12C:
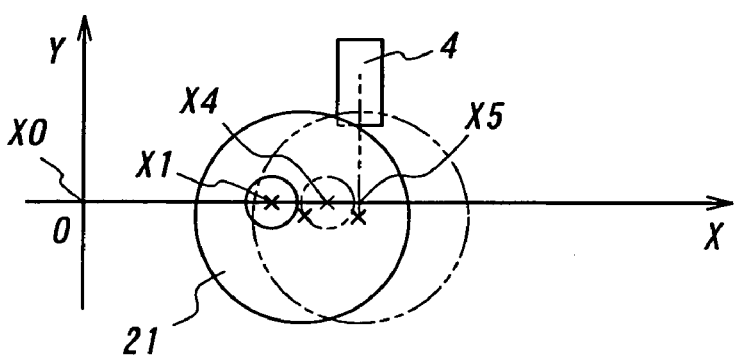

Next, in Step S17, the spindle 16 is moved from the position of the point X3 (X3, 0) in the homeward direction toward the origin by the same distance as the outward distance by the X axis movement mechanism 2. During this movement, in Step S18, the rotation axis position X4 (X4, 0) of the spindle 16 when the line sensor 4 is most shielded (time of detecting the outermost outer periphery edge) is detected, and temporarily stored by the storage means as in the outward movement. Then, in Step S19, data collection of the outer periphery edge of the wafer 21 by the line sensor 4 is finished when the rotation axis of the spindle 16 passes through the point XI (X1, 0). Subsequently, in Step S20, whether information on positions of X2 and X4 could be obtained or not is determined. If information of either X2 or X4 is not obtained, the procedure goes back to Step S12. If information of the both X2 and X4 is obtained, the information is stored by information storage means inside the controller 24 of the wafer positioning device 1. Subsequently, in Step S21, the obtained information is used for calculating an intersection point X5 between a straight line which passes through the center part of the light acceptance part of the line sensor 4 and which extends in the extending direction thereof and the X axis, shown in FIG. 12C. The intersection point X5 is a point where the rotation axis of the spindle 16 should be positioned.

Figure 13:
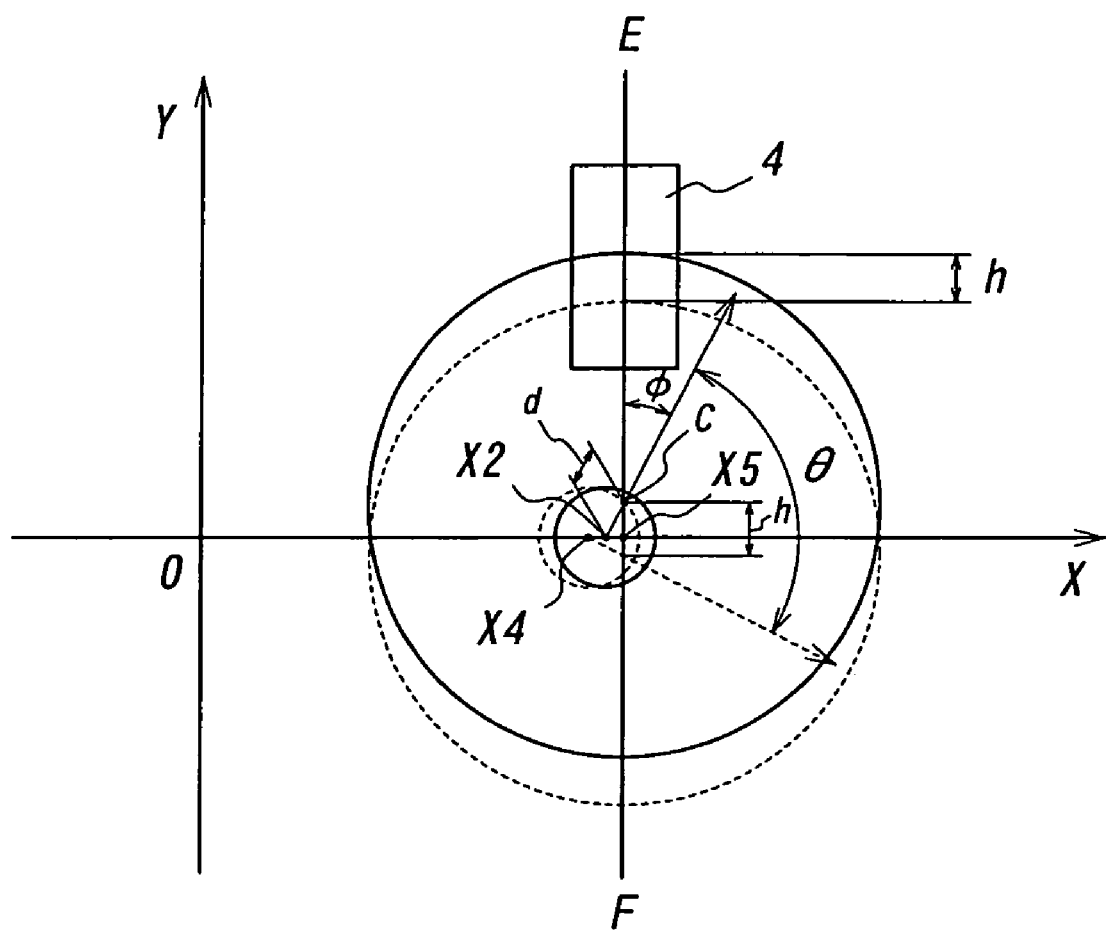
FIG. 13 is an explanation drawing, which shows a position at which the line sensor in the outward and homeward directions is most shielded in the case that a wafer is rotated by a given angle at a turn back point.
Figure 14A:
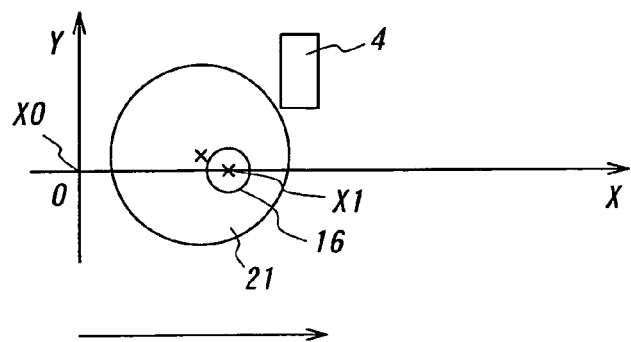
FIGS. 14A, 14B, and 14C are explanation drawings, which show operation states of the device of the foregoing example in a method of an example in which a rotation angle is 90°.
Figure 14B:
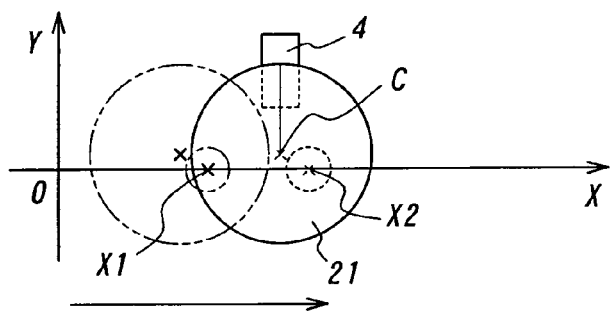
Figure 14C:
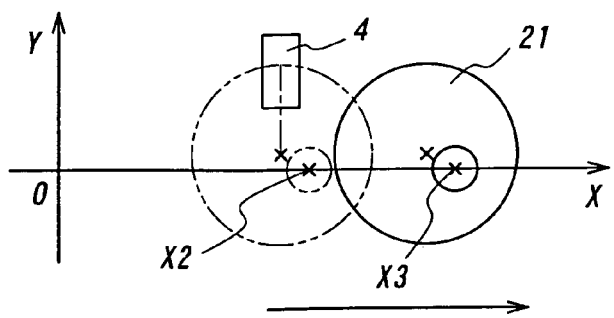
Figure 15A:
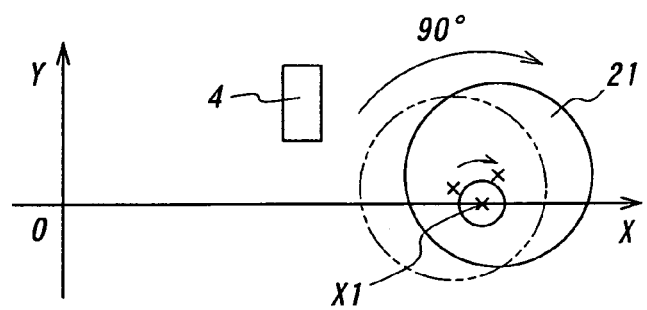
FIGS. 15A, 15B, and 15C are explanation drawings, which show operation states of the device of the foregoing example in a method of an example in which a rotation angle is 90°.
Figure 15B:
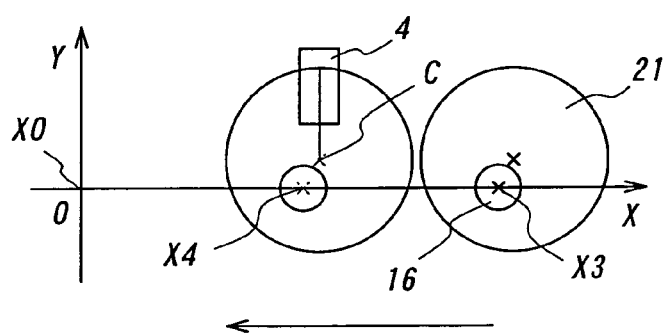
Figure 15C:
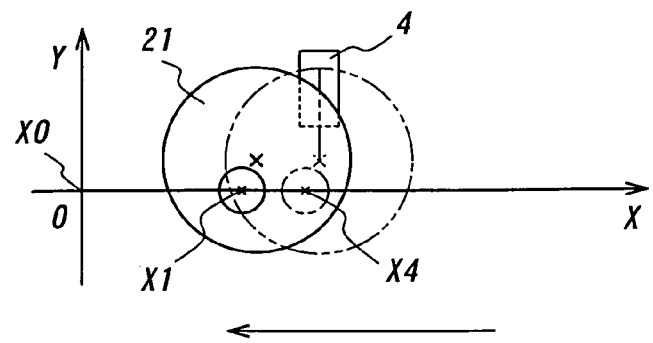

FIG. 13 shows a location (shown in a full line) of the wafer 21 at the rotation axis position X2 on the X axis when the line sensor 4 is most shielded by the wafer 21 on the outward direction (time of detecting the outermost outer periphery edge); and a location (shown in a dashed line) of the wafer 21 at the rotation axis position X4 on the X axis when the line sensor 4 is most shielded by the wafer 21 on the homeward direction (time of detecting the outermost outer periphery edge). A calculation method for the intersection point X5 will be hereinafter described by using this FIG. 13.

Here, a reference plate is the disc-shaped wafer 21. In the case where an angle made by a straight line passing through the spindle rotation axis position X2 on the X axis and the center point C of the wafer 21 (shown by a full line arrow in FIG. 13) and the Y axis when the wafer passes the line sensor 4 in the outward direction is Φ; a distance (eccentric amount) between the spindle rotation axis and a center point of the wafer 21 is d; and a straight line passing through the spindle rotation axis position X4 on the X axis and the center point C of the wafer 21 is located as a dashed line arrow in FIG. 13 by rotating the spindle 16 by an angle of θ at the turning point, the following geometric relations are obtained:

$$X5-X2 = d \sin \phi \quad (21)$$

$$X5-X4 = d \sin(\phi+\theta) \quad (22)$$

$$h = d \cos(\phi+\theta) - d \cos \phi \quad (23)$$

Here, h represents the distance in the Y axis direction between an outer periphery edge (shown by a full line in the figure) of the wafer 21 at the rotation axis position X2, and an outer periphery edge (shown by a dashed line in the figure) of the wafer 21 at the rotation axis position X4.

When Expression (22) is decomposed by a formula, the following expression is obtained:

$$X5-X4 = d(\sin \phi \cdot \cos \theta + \cos \phi \cdot \sin \theta) = d \sin \phi \cdot \cos \theta + d \cos \phi \cdot \sin \theta \quad (22')$$

When Expression (23) is decomposed by a formula, the following expression is obtained:

$$h = d(\cos \phi \cdot \cos \theta \cdot \sin \phi - \sin \theta) - d \cos \phi = d \cos \phi (\cos \theta \cdot 1) - d \sin \phi \cdot \sin \theta \quad (23')$$

When an expression obtained by multiplying Expression (23') by sin θ from an expression obtained by multiplying Expression (22') by (cos θ−1), and Expression (21) is assigned to the result, the following expression is obtained:

$$(2X5-X2-X4)(1-\cos \theta) = -h \sin \theta \quad (24)$$

then, $$X5 = \{X2+X4-h \sin \theta/(1-\cos \theta)\}/2 \quad (25)$$

Accordingly, the position X5 can be found by the general formula of Expression 25.

Here, if θ=180° according to the method of the foregoing example, sin θ/(1−cos θ)=0 is expressed. Then, Expression (25) is expressed as follows:

$$X5 = (X2+X4)/2 \quad (26)$$

This Expression (26) includes no trigonometric function and h. Therefore, when the wafer is rotated by 180° at the turning point, there is no need to calculate the trigonometric function and convert the light acceptance amount of the line sensor 4 into the distance h. Consequently, adopting this expression is preferable since the position X5 can be calculated by the controller 24 as calculating means more speedy.

Figure 17:
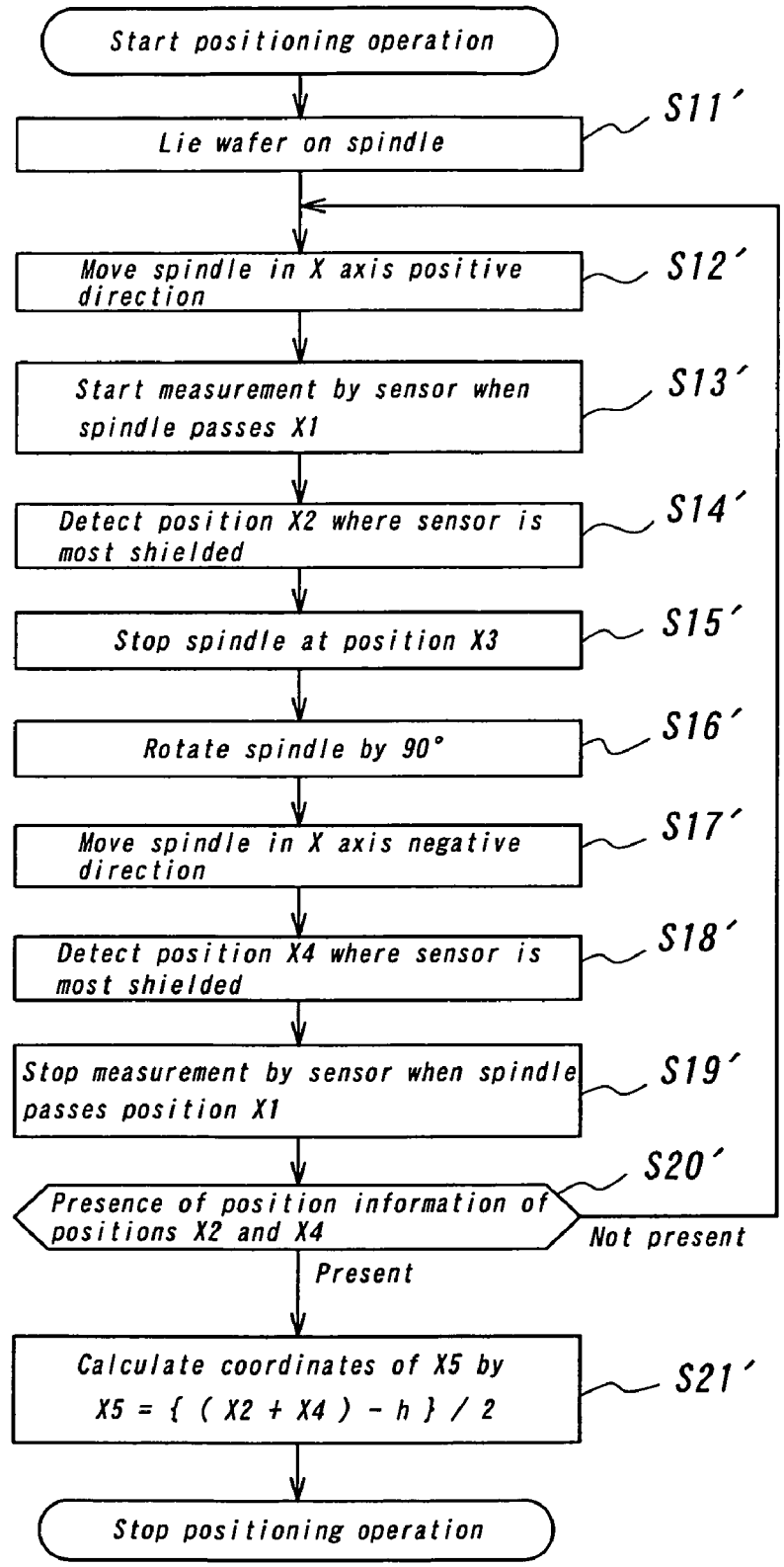
FIG. 17 is a flow chart, which shows a procedure for the method of the example in which a rotation angle is 90° in the device of the foregoing example.
Figure 18:
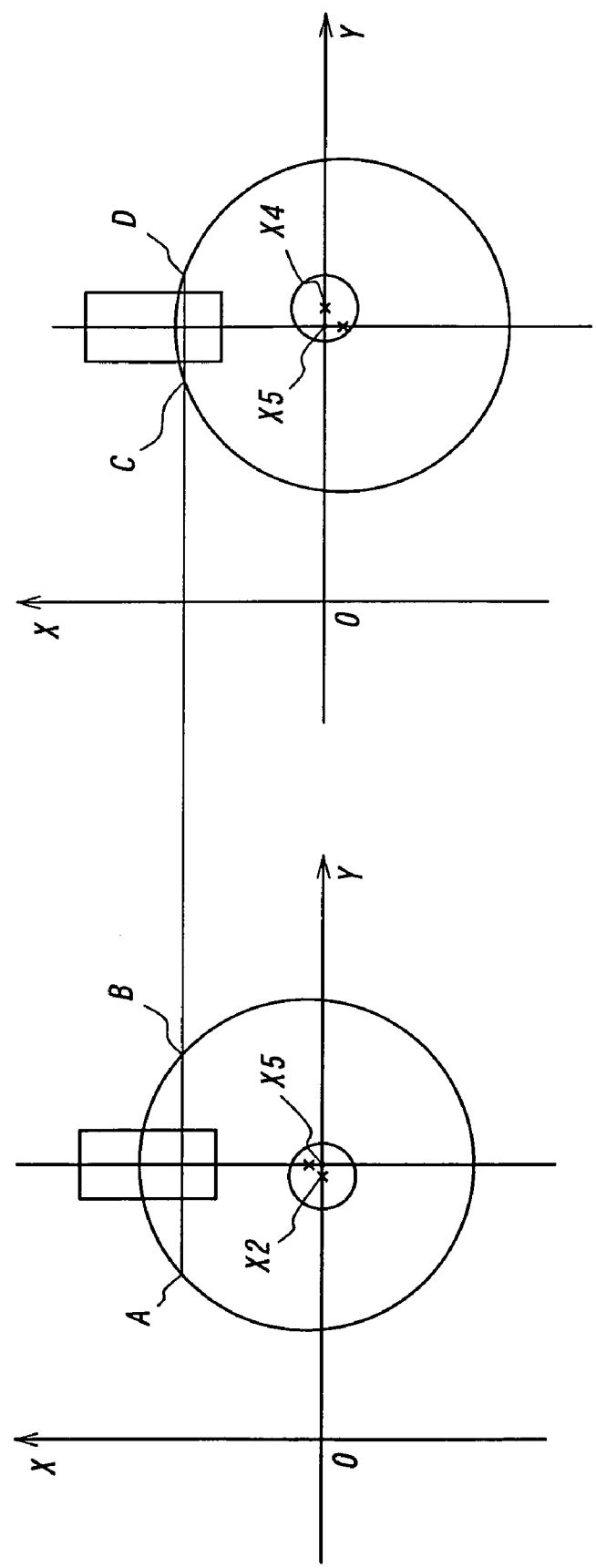
FIG. 18 is an explanation drawing, which shows other method by which the line sensor detects an outermost outer periphery edge of the disc in the direction of a first straight line.
Figure 19:
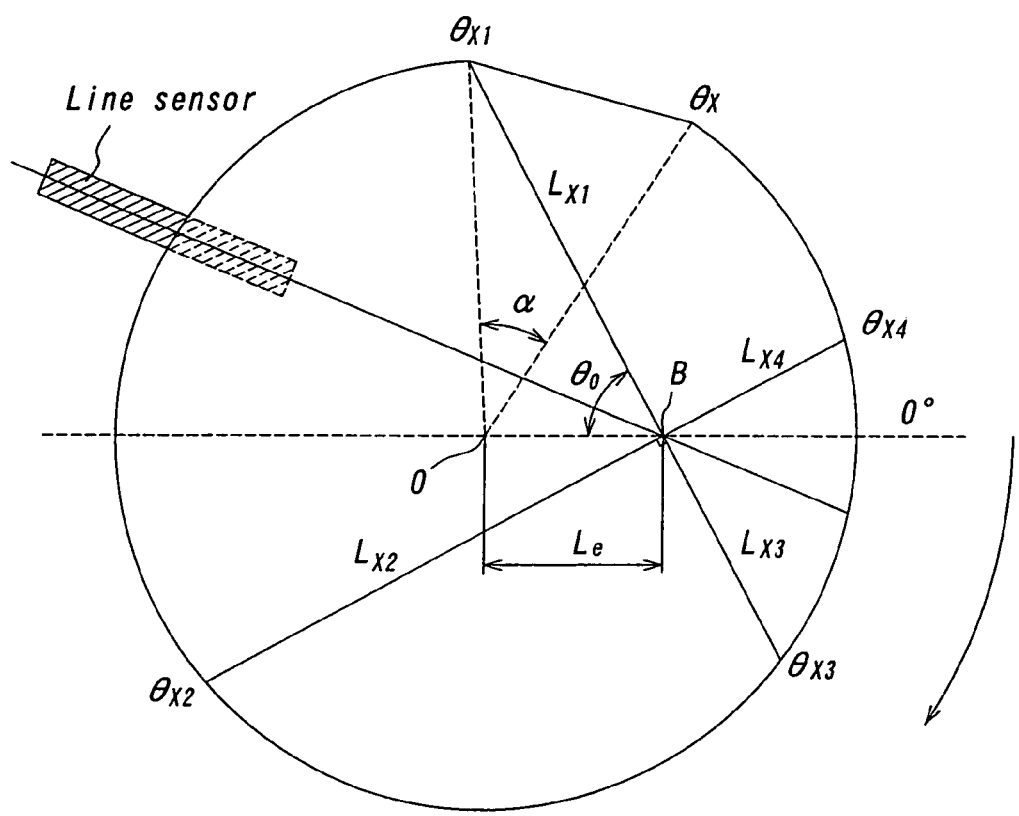
FIG. 19 is an explanation drawing, which shows a wafer positioning method in a conventional device.
Figure 20:
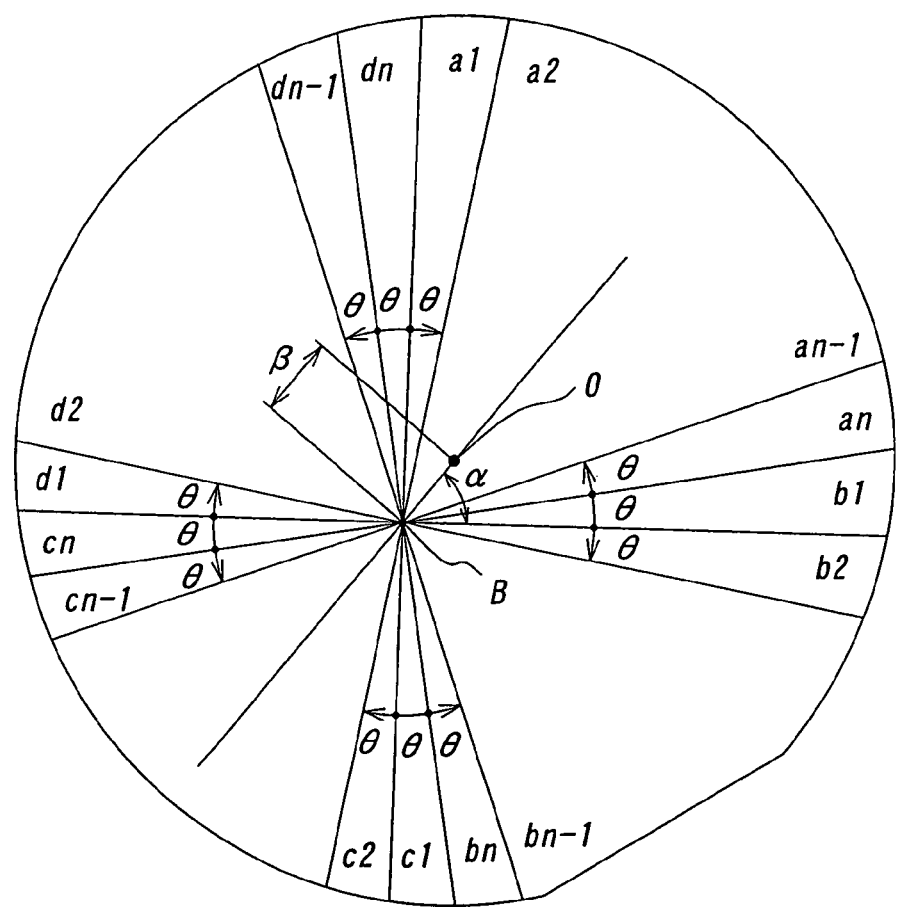
FIG. 20 is an explanation drawing, which shows a wafer positioning method in other conventional device.

FIG. 17 shows a flow chart showing a procedure for a wafer seat rotation axis positioning method for other example of the invention. In this example, differently from Step S16 in the foregoing example, in Step S16', the spindle 16 is rotated by 90° by the motor 8 at the turning point. Then, as shown in FIGS. 14A, 14B, 14C, 15A, 15B, and 15C, the spindle 16 or the wafer 21 is moved outward and homeward. Differently from Step S21 in the foregoing example, in Step S21', θ=90° and sin θ/(1−cos θ)=1 are adopted. Expression (25) thereby becomes as follows:

$$X5 = (X2+X4-h)/2 \quad (27)$$

In the method of this example, it is necessary to convert the light acceptance amount of the line sensor 4 into the distance h, but not necessary to calculate the trigonometric functions. Therefore, adopting this method is preferable since the position X5 can be calculated by the controller 24 as calculating means more speedy.

The coordinates of the position X5 on the X axis calculated as above is stored by the information storage means inside the controller 24. Then, this coordinates-are used as a reference position (positioning position) on the X axis for the rotation axis of the spindle 16, when the next process of wafer positioning operation is performed.

As above, according to the wafer seat rotation axis positioning methods of the foregoing examples and the wafer positioning devices of the foregoing examples using them, positioning precision can be significantly improved, since the spindle rotation axis of the wafer positioning device is arranged on the line perpendicular to the X axis, which passes through the central point of the line sensor, that is in front of the line sensor. Further, when the wafer rotation at the turning point is set to 180° as in the foregoing example, not only the calculation speed is high, but also there is no need to convert the light acceptance amount of the sensor into the distance. Therefore, there is no need to use a high-precision line sensor using a CCD or a laser, an inexpensive line sensor can be used, and the invention can be applied to any positioning device. Consequently, the invention has a wide application range, and enables to manufacture a wafer positioning device at a low cost.

The wafer seat rotation axis positioning operation is performed only when the rotation axis positioning operation is required in the case that the rotation axis position is beyond a certain range, for example, at the time immediately after the installment of the wafer positioning device. As long as the rotation axis position is located in a certain range, it is not necessary to perform the wafer seat rotation axis positioning operation just before the regular wafer positioning operation. Therefore productivity is not lowered. In addition, since the controller includes the program to perform the foregoing wafer seat rotation axis positioning operation, in the case that the rotation axis position becomes beyond the foregoing certain range due to an accident etc. Therefore, labored adjustment operation after accident can be omitted, the wafer positioning device becomes a maintenance free device, and the maintenance cost can be reduced.

As above, descriptions have been given based on the examples shown in the figures. However, this invention is not limited to the foregoing examples, and may be modified as appropriate within the scope of claims. For example, the wafer seat may be rotated about the rotation axis at a given angle instead of 180° or 90° at the turning point. However, 360° and its multiples are excluded since different data cannot be obtained.

INDUSTRIAL APPLICABILITY

According to the invention, in a wafer positioning operation to obtain an eccentric amount by rotating a wafer, its speed and its precision can be improved. Further, the invention enables to allow a skilled engineer to skip the step of time-consuming adjustment of a rotation axis position of a wafer seat. Furthermore, the invention enables to prevent precision lowering of a positioning operation after trouble.

The invention claimed is:

1. A method of positioning a circular wafer with a wafer positioning device comprising a line sensor capable of generating a sensor line, a wafer seat capable of seating a wafer, a wafer seat driver capable of moving the wafer seat in two-dimensional directions or three-dimensional directions and rotating the wafer seat about a given rotation axis to move a wafer center point to a given position and to orient a wafer notch part in a given direction, and a calculation unit capable of calculating a wafer center point position and a notch part angle based on a rotation of the wafer seat by the wafer seat driver and detection results of an outer periphery edge of the wafer lying on the wafer seat by the line sensor, the method comprising:

positioning the wafer seat at an initial reference position, such that the rotation axis of the wafer seat intersects the sensor line of the line sensor, and rotating the wafer seat on which the wafer lies on the rotation axis, by the wafer seat driver;

finding $\alpha$, $\beta_1$, $\beta_2$, and Lm based on the rotation angle of the wafer seat as measured from the initial reference position and the detection results of the outer periphery edge of the wafer lying on the wafer seat by the line sensor, and geometrically calculating $\theta$, $\Delta X$, and $\Delta Y$ as measured from the initial reference position, by the calculation unit; and moving the rotation axis in the directions $\Delta X$ and $\Delta Y$, rotating the wafer seat about the rotation axis by the rotation angle $\theta$, and then stopping the wafer seat, without removing the wafer from the wafer seat, by the wafer seat driver, wherein $$d = Lm - r$$

$\theta$ is calculated or approximated as $$\theta = \gamma + [\beta_1 + \beta_2 + \arcsin\{(d/r)\sin(\beta_1-\alpha)\} + \arcsin\{(d/r)\sin(\beta_2-\alpha)\}]/2 \text{ or}$$

$$\theta \approx \gamma + [\beta_1 + \beta_2 + (d/r)\{\sin(\beta_1-\alpha) + \sin(\beta_2-\alpha)\}]$$

$$\Delta X = d\sin(\theta-\alpha)$$

$$\Delta Y = d\cos(\theta-\alpha)$$

where

Lm is a maximum eccentric radius or a minimum eccentric radius of the wafer as measured from an eccentric center of the wafer, defined by an intersection of the rotation axis with the wafer, to the outer periphery edge of the wafer, d is a deviance distance from the wafer center point position to the eccentric center of the wafer, r is a predetermined radius of the wafer, $\theta$ is a rotation angle of the wafer seat about the rotation axis, as measured from the initial reference position, to orient the notch part in the given direction, $\alpha$ is a rotation angle of the wafer seat about the rotation axis, as measured from the initial reference position, to a position obtained when the eccentric radius of the wafer firstly becomes the maximum eccentric radius or the minimum eccentric radius, $\beta_1$ is a rotation angle of the wafer seat about the rotation axis, as measured from the initial reference position, to a first end of the notch part, $\beta_2$ is a rotation angle of the wafer seat about the rotation axis, as measured from the initial reference position, to a final end of the notch part, $\gamma$ is an angle, with respect to the initial reference position, formed between the sensor line and a line extending through both the wafer center point and a point bisecting a line between the first end and the final end of the notch part, $\Delta X$ is a movement distance of the rotation axis in an X axis direction, and $\Delta Y$ is a movement distance of the rotation axis in a Y axis direction.

2. The method according to claim 1, wherein the calculation unit approximates the rotation angle $\theta$ uses the expression:

$$\theta \approx \gamma + [\beta_1 + \beta_2 + (d/r)\{\sin(\beta_1-\alpha) + \sin(\beta_2-\alpha)\}].$$

3. The method according to claim 2, wherein in order to obtain the notch part position of the wafer, the calculation unit finds the angle $\beta_1$ at $\Delta L_1 = 0$ where $\Delta L_1$ changes from 0 to a positive and finds the angle $\beta_2$ at $\Delta L_2 = 0$ when $\Delta L_2$ changes from a positive to 0:

$$\Delta L_1 = [d\cos(\beta_1-\alpha) + \{r^2 - d^2\sin^2(\beta_1-\alpha)\}^{1/2}] - L$$

$$\Delta L_2 = [d\cos(\beta_2-\alpha) + \{r^2 - d^2\sin^2(\beta_1-\alpha)\}^{1/2}] - L$$

where L is an eccentric radius.

4. The method according to claim 1, wherein in order to obtain the notch part position of the wafer, the calculation unit finds the angle $\beta_1$ at $\Delta L_1 = 0$ where $\Delta L_1$ changes from 0 to a positive and finds the angle $\beta_2$ at $\Delta L_2 = 0$ when $\Delta L_2$ changes from a positive to 0:

$$\Delta L_1 = [d\cos(\beta_1-\alpha) + \{r^2 - d^2\sin^2(\beta_1-\alpha)\}^{1/2}] - L$$

$$\Delta L_2 = [d\cos(\beta_2-\alpha) + \{r^2 - d^2\sin^2(\beta_2-\alpha)\}^{1/2}] - L$$

where L is an eccentric radius.

5. A wafer positioning device, comprising:

a line sensor capable of generating a sensor line, a wafer seat capable of a wafer, wafer seat driver capable of moving the wafer seat in two-dimensional directions or three-dimensional directions and rotating the wafer seat on about a given rotation axis, to move a wafer center point to a given position and to orient a wafer notch part in a given direction, and a calculation unit capable of calculating a wafer center point position and a notch part angle based on a rotation of the wafer seat by the wafer seat driver and detection results of an outer periphery edge of the wafer lying on the wafer seat by the line sensor, wherein the wafer positioning device:

positions the wafer seat at an initial reference position, such that the rotation axis of the wafer seat intersects the sensor line of the line sensor, and rotates the wafer seat on which the wafer lies about the rotation axis, moves the rotation axis in the directions $\Delta X$ and $\Delta Y$, rotates the wafer seat about the rotation axis by the rotation angle $\theta$, and then stops the wafer seat, finds $\alpha$, $\beta_1$, $\beta_2$, and Lm based on the rotation angle of the wafer seat as measured from the initial reference position and the detection results of the outer periphery edge of the wafer lying on the wafer seat by the line sensor, and geometrically calculates $\theta$, $\Delta X$, and $\Delta Y$ as measured from the initial reference position, wherein $$d = Lm - r$$

$\theta$ is calculated or approximated as $$\theta = \gamma + [\beta_1 + \beta_2 + \arcsin\{(d/r)\sin(\beta_1-\alpha)\} + \arcsin\{(d/r)\sin(\beta_2-\alpha)\}]/2 \text{ or}$$

$$\theta \approx \gamma + [\beta_1 + \beta_2 + (d/r)\{\sin(\beta_1-\alpha) + \sin(\beta_2-\alpha)\}]$$

$$\Delta X = d\sin(\theta-\alpha)$$

$$\Delta Y = d\cos(\theta-\alpha)$$

where
- Lm is a maximum eccentric radius or a minimum eccentric radius of the wafer as measured from an eccentric center of the wafer, defined by an intersection of the rotation axis with the wafer, to the outer periphery edge of the wafer,
- d is a deviance distance from the wafer center point position to the eccentric center of the wafer,
- r is a predetermined radius of the wafer,
- θ is a rotation angle of the wafer seat about the rotation axis, as measured from the initial reference position, to orient the notch part in the given direction,
- α is a rotation angle of the wafer seat about the rotation axis, as measured from the initial reference position, to a position obtained when the eccentric radius of the wafer firstly becomes the maximum eccentric radius or the minimum eccentric radius,
- $\beta_1$ is a rotation angle of the wafer seat about the rotation axis, as measured from the initial reference position, to a first end of the notch part,
- $\beta_2$ is a rotation angle of the wafer seat about the rotation axis, as measured from the initial reference position, to a final end of the notch part,
- γ is an angle, with respect to the initial reference position, formed between the sensor line and a line extending through both the wafer center point and a point bisecting a line between the first end and the final end of the notch part,
- ΔX is a movement distance of the rotation axis in an X axis direction, and
- ΔY is a movement distance of the rotation axis in a Y axis direction.

6. The wafer positioning device according to claim 5, further comprising:
an arm and a finger for transporting a wafer; and
a drive unit for the arm and the finger.

7. The wafer positioning device according to claim 6, wherein:
when wafer positioning is performed by raising the wafer seat from a position where the wafer positioning device has received the wafer, the drive unit for the arm and the finger makes the finger wait at a position where the wafer is handed over to the wafer seat, and
when wafer positioning is performed by maintaining the wafer seat at a position where the wafer positioning device receives the wafer, the drive unit for the arm and the finger makes the finger wait below a position where the wafer has been handed over to the wafer seat.

8. A method of positioning a wafer seat rotation axis in a wafer positioning device comprising a line sensor, a wafer seat capable of seating a wafer a wafer seat driver capable of moving the wafer seat at least in a one dimensional direction and rotating the wafer seat about a given rotation axis, and a calculation unit, the wafer positioning device performing positioning of the wafer by moving a wafer center point to a given position by the wafer seat driver and calculating a wafer center point position by the calculation unit based on a rotation of the wafer seat and detection results of an outer periphery edge of the circular wafer lying on the wafer seat by the line sensor, when the rotation axis of the wafer seat is positioned on a first straight line which passes through a center part of the line sensor and extends in an extending direction thereof before the calculation process, the method comprising:
moving, without rotation, the wafer seat on which a reference plate lies along a second straight line perpendicular to the first straight line such that the rotation axis turns back and passes twice or more between two points sandwiching a position of the rotation axis of the wafer seat when the line sensor detects an outermost outer periphery edge of the reference plate in a direction of the first straight line, and rotating the wafer seat by a given angle except for 360° and its multiples about the rotation axis when turning back the wafer seat at one or both of the two points, or at points outside the two points, by the wafer seat driver;
geometrically calculating an intersection point position between the second straight line and the first straight line based on data which the line sensor obtains when the reference plate passes without rotation the line sensor twice or more by the turnback movement of the wafer seat and the rotation angle, by the calculation unit; and
moving the rotation axis to the calculated intersection point position, and positioning the rotation axis on the first straight line, by the wafer seat driver.

9. The method according to claim 8, wherein the reference plate is a disc.

10. The method according to claim 9, wherein when the calculation unit geometrically calculates the intersection point position based on the data which the line sensor has obtained when the disc passes the line sensor by the turnback movement of the wafer seat and the rotation angle, the calculation unit finds the position of the rotation axis of the wafer seat when the line sensor detects the outermost outer periphery edge of the reference plate in the direction of the first straight line on an assumption that the outermost outer periphery edge of the disc is on a perpendicular bisector of a straight line connecting two points of the outer periphery edge of the disc across which a fixed point of the line sensor cuts.

11. The method according to any one of claims 9 and 10, wherein an angle at which the wafer seat is rotated when the wafer seat driver turns back the wafer seat is any one of 90° and 180°.

12. A wafer positioning device comprising:
a line sensor;
a wafer seat capable of seating a wafer;
a wafer seat driver capable of moving the wafer seat at least in a one dimensional direction and rotating the wafer seat about a given rotation axis; and
a calculation unit,
the wafer positioning device performing positioning the wafer by moving a wafer center point to a given position by the wafer seat driver through a process to calculate a wafer center point position by the calculation unit based on a rotation of the wafer seat and detection results of an outer periphery edge of the circular wafer lying on the wafer seat by the line sensor,
wherein the wafer seat driver moves, without rotation, the wafer seat on which a reference plate lies along a second straight line perpendicular to a first straight line which passes through a center part of the line sensor and extends in an extending direction thereof such that the rotation axis turns back and passes twice or more between two points sandwiching a position of the rotation axis of the wafer seat when the line sensor detects an outermost outer periphery edge of the reference plate in a direction of the first straight line, rotates the wafer seat by a given angle except for 360° and its multiples about the rotation axis when turning back the wafer seat at one or both of the two points, or at points outside the two points, and moves the rotation axis to an intersection point position between the second straight line and the first straight line which is calculated by the calculation unit, thus positioning the rotation axis on the first straight line, and the calculation unit geometrically calculates the intersection point position between the second straight line and the first straight line based on data which the line sensor obtains when the reference plate passes without rotation the line sensor twice or more by the turnback movement of the wafer seat and the rotation angle.

13. The wafer positioning device according to claim 12, wherein an angle at which the wafer seat is rotated when the wafer seat is turned back by the wafer seat driver is any one of 90° and 180°.

14. A wafer positioning device comprising:
a line sensor capable of generating a sensor line,
a wafer seat capable of seating a circular wafer,
a wafer seat driver capable of moving the wafer seat in two-dimensional directions or three dimensional directions and rotating the wafer seat about a given rotation axis,
to move a wafer center point to a given position and to orient a wafer notch part in a given direction, and
a calculation unit capable of calculating a wafer center point position and a notch part angle based on a rotation of the wafer seat by the wafer seat driver and detection results of an outer periphery edge of the wafer lying on the wafer seat by the line sensor,
wherein the wafer positioning device:
positions the wafer seat at an initial reference position, such that a rotation axis of the wafer seat intersects the sensor line of the line sensor, and rotates the wafer seat on which the wafer lies about the rotation axis; and
moves the rotation axis in the directions of $\Delta X$ and $\Delta Y$, rotates the wafer seat about the rotation axis by the rotation angle $\theta$, and then stops the wafer seat,
finds $\alpha, \beta_1, \beta_2$, and Lm based on the rotation angle of the wafer seat as measured from the initial reference position and the detection results of the outer periphery edge of the wafer lying on the wafer seat by the line sensor, and
geometrically calculates $\theta$, $\Delta X$, and $\Delta Y$ as measured from the initial reference position;
wherein $d = Lm - r$ $\theta$ is calculated or approximated as $\theta = +[\beta_1 + \beta_2 + \arcsin\{(d/r)\sin(\beta_1-\alpha)\} \arcsin\{(d/r)\sin(\beta_2-\alpha)\}]/2$ or $\theta \approx \gamma + [\beta_1 + \beta_2 + (d/r)\{\sin(\beta_1-\alpha) + \sin(\beta-\alpha)\}]$ $\Delta X = d \sin(\theta-\alpha)$ $\Delta Y = d \cos(\theta-\alpha)$ where
Lm is a maximum eccentric radius or a minimum eccentric radius of the wafer as measured from an eccentric center of the wafer, defined by an intersection of the rotation axis with the wafer, to the outer periphery edge of the wafer, d is a deviance distance from the wafer center point position to the eccentric center of the wafer, r is a predetermined radius of the wafer, $\theta$ is a rotation angle of the wafer seat about the rotation axis, as measured from the initial reference position, to orient the notch part in the given direction, $\alpha$ is a rotation angle of the wafer seat about the rotation axis, as measured from the initial reference position, to a position obtained when the eccentric radius of the wafer firstly becomes the maximum eccentric radius or the minimum eccentric radius, $\beta_1$ is a rotation angle of the wafer seat about the rotation axis, as measured from the initial reference position, to a first end of the notch part, $\beta_2$ is a rotation angle of the wafer seat about the rotation axis, as measured from the initial reference position, to a final end of the notch part, $\gamma$ is an angle, with respect to the initial reference position, formed between the sensor line and a line extending through both the wafer center point and a point bisecting a line between the first end and the final end of the notch part, $\Delta X$ is a movement distance of the rotation axis in an X axis direction, and $\Delta Y$ is a movement distance of the rotation axis in a Y axis direction; and wherein in order to obtain the notch part position of the wafer, the calculation unit finds the angle $\beta_1$ at $\Delta L_1 = 0$ where $\Delta L_1$ changes from 0 to a positive and finds the angle $\beta_2$ at $\Delta L_2 = 0$ when $\Delta L_2$ changes from a positive to 0:

$\Delta L_1 = [d \cos(\beta_1-\alpha) + \{r^2 - d^2 \sin(\beta_1-+)\}^{1/2}] - l$ $\Delta L_2 = [d \cos(\beta_2-\alpha) + \{r^2 - d^2 \sin(\beta_2-+)\}^{1/2}] - l$ where L is an eccentric radius.

15. The wafer positioning device according to claim 14, further comprising:
an arm and a finger for transporting a wafer; and
a drive unit for the arm and the finger.

16. The wafer positioning device according to claim 15, wherein when wafer positioning is performed by raising the wafer seat from a position where the wafer positioning device has received the wafer, the drive unit for the arm and the finger makes the finger wait at a position where the wafer is banded over to the wafer seat, and when wafer positioning is performed by maintaining the wafer seat at a position where the wafer positioning device receives the wafer, the drive unit for the arm and the finger makes the finger wait below a position where the wafer has been handed over to the wafer seat.

* * * * *